United States Patent
Lee et al.

(10) Patent No.: US 7,045,413 B2
(45) Date of Patent: May 16, 2006

(54) METHOD OF MANUFACTURING A SEMICONDUCTOR INTEGRATED CIRCUIT USING A SELECTIVE DISPOSABLE SPACER TECHNIQUE AND SEMICONDUCTOR INTEGRATED CIRCUIT MANUFACTURED THEREBY

(75) Inventors: Sang-Eun Lee, Gyeonggi-do (KR); Yun-Heub Song, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/773,805

(22) Filed: Feb. 5, 2004

(65) Prior Publication Data
US 2004/0159886 A1    Aug. 19, 2004

(30) Foreign Application Priority Data
Feb. 6, 2003  (KR) .................................. 2003-7547

(51) Int. Cl.
H01L 21/8238  (2006.01)
H01L 21/00  (2006.01)
H01L 21/84  (2006.01)
H01L 21/8242  (2006.01)
H01L 21/336  (2006.01)

(52) U.S. Cl. .................. 438/230; 438/152; 438/151; 438/155; 438/244; 438/301; 438/306; 438/634

(58) Field of Classification Search ................ 438/244, 438/248, 301, 306, 151, 152, 155, 230, 634
See application file for complete search history.

(56) References Cited

U.S. PATENT DOCUMENTS

| 6,043,537 | A | 3/2000 | Jun et al. | |
| 6,433,381 | B1 * | 8/2002 | Mizutani et al. | 257/311 |
| 6,509,216 | B1 * | 1/2003 | Chien et al. | 438/152 |
| 6,531,353 | B1 * | 3/2003 | Lee | 438/210 |
| 6,873,019 | B1 * | 3/2005 | Ida et al. | 257/382 |

* cited by examiner

Primary Examiner—Steven Loke
Assistant Examiner—Samuel A. Gebremariam
(74) Attorney, Agent, or Firm—Marger Johnson & McCollom, P.C.

(57) ABSTRACT

Methods of manufacturing a semiconductor integrated circuit using selective disposable spacer technology and semiconductor integrated circuits manufactured thereby: The method includes forming a plurality of gate patterns on a semiconductor substrate. Gap regions between the gate patterns include first spaces having a first width and second spaces having a second width greater than the first width. Spacers are formed on sidewalls of the second spaces, and spacer layer patterns filling the first spaces are also formed together with the spacers. The spacers are selectively removed to expose the sidewalls of the first spaces. As a result, the semiconductor integrated circuit includes wide spaces enlarged by the removal of the spacers and narrow and deep spaces filled with the spacer layer patterns.

27 Claims, 29 Drawing Sheets

US 7,045,413 B2

METHOD OF MANUFACTURING A SEMICONDUCTOR INTEGRATED CIRCUIT USING A SELECTIVE DISPOSABLE SPACER TECHNIQUE AND SEMICONDUCTOR INTEGRATED CIRCUIT MANUFACTURED THEREBY

RELATED APPLICATIONS

This application claims the benefit of Korean Patent Application No. 2003-7547, filed Feb. 6, 2003, the contents of which are incorporated herein by reference in their entirety.

BACKGROUND OF INVENTION

1. Field of the Invention

The present invention relates to a method of manufacturing a semiconductor integrated circuit and a semiconductor integrated circuit manufactured thereby and, more particularly, to a method of manufacturing a semiconductor integrated circuit using a selective disposable spacer technique and a semiconductor integrated circuit manufactured thereby.

2. Description of Related Art

Metal-Oxide-Semiconductor (MOS) transistors exhibit various advantages as compared to bipolar transistors. For example, the MOS transistors are suitable for a semiconductor integrated circuit (IC) having a high integration density and a low operation voltage with low power consumption. Therefore, most semiconductor ICs employ the MOS transistors as switching elements.

As semiconductor ICs have become more highly integrated, MOS transistors have been scaled down. As a result, the electrical characteristics and reliability of such semiconductor ICs are sometimes degraded thereby causing malfunctions. For example, attempts to increase device integration density in semiconductor ICs have typically resulted in reduction of the widths of gate electrodes of MOS transistors and in the reduction of junction depths of source/drain regions thereof. In such devices, electrical resistances of the gate electrodes and the source/drain regions are increased, and the reliability (for example, hot carrier effect and short channel effect) and the electrical characteristic (for example, signal delay time) of the MOS transistors can be degraded. In order to solve these problems, a self-aligned silicide (SALICIDE) technique and a lightly doped drain (LDD) structure have been widely used in fabrication of MOS transistors. Gate spacers are generally formed on the sidewalls of the gate electrodes in order to realize the LDD-type source/drain structure and the SALICIDE technique.

The fabrication technology of the semiconductor ICs having the gate spacers is taught in U.S. Pat. No. 6,043,537 to Jun et al., entitled "Embedded memory logic device using self-aligned silicide and manufacturing method therefore."

The manufacturing method of semiconductor devices according to the U.S. Pat. No. 6,043,537 includes preparing a semiconductor substrate that has a DRAM cell array region and a peripheral circuit region. Active regions are formed at the semiconductor substrates. Word lines and gate electrodes are formed in the DRAM cell array region and the peripheral circuit region, respectively. The word lines are formed to extend across the active regions in the DRAM cell array region, and the gate electrodes are formed to extend across the active regions in the peripheral circuit region. Impurity ions are then implanted into the active regions using the word lines and the gate electrodes as ion implantation masks, thereby forming low concentration source/drain regions. As a result, first and second low concentration source regions as well as a common low concentration drain region are formed at the respective active regions in the DRAM cell array region. The first and second low concentration source regions correspond to storage node junctions of DRAM cells.

A conformal spacer layer is formed on an entire surface of the semiconductor substrate having the low concentration source/drain regions. A photoresist pattern is formed on the spacer layer. The photoresist pattern is formed over the first and second low concentration source regions. The spacer layer is anisotropically etched using the photoresist pattern as an etch mask. Accordingly, spacers are formed on the sidewalls of the word lines and the gate electrodes. However, the conformal spacer layer on the first and second low concentration source regions is not anisotropically etched due to the photoresist pattern. Therefore, spacer layer patterns acting as salicide blocking patterns are formed on the first and second low concentration source regions. After removing the photoresist pattern, impurity ions are implanted into the active regions using the word lines, the gate electrodes, the spacers and the salicide blocking patterns as ion implantation masks, thereby forming high concentration source/drain regions. As a result, LDD-type source/drain regions are formed in the active regions of the peripheral circuit regions, and LDD-type common drain regions are formed in the active regions of the DRAM cell array region.

Subsequently, a metal layer is formed on an entire surface of the semiconductor substrate having the LDD-type source/drain regions, and the metal layer is annealed to form a metal silicide layer. As a result, the metal silicide layer is selectively formed on the word lines, the common drain regions, the gate electrodes and the source/drain regions in the peripheral circuit region. In other words, the metal silicide layer is not formed on the storage nodes, i.e., the first and second low concentration source regions.

Eventually, according to the U.S. Pat. No. 6,043,537, the leakage current that flows through the storage node junctions can be reduced.

In addition, spacers are widely used in fabrication of self-aligned contact holes. In this case, the spacers are formed of an insulating layer (for example, a silicon nitride layer) having an etching selectivity with respect to a conventional interlayer insulating layer.

However, if spaces between interconnection lines such as the word lines are reduced, actual areas of the source/drain regions exposed by the self-aligned contact holes are greatly reduced because of the presence of the spacers.

SUMMARY OF THE INVENTION

The present invention provides, among other things, a method of manufacturing a semiconductor integrated circuit using a selective disposable spacer technique and a semiconductor integrated circuit manufactured thereby.

In one embodiment of the invention, a method of fabricating a semiconductor integrated circuit includes forming a device isolation layer at a predetermined region of a semiconductor substrate to define a first active region and a second active region. A plurality of first gate patterns extend across the first active region. The regions between the first gate patterns include a first opening having a first width and a second opening having a second width greater than the first width. The device isolation layer exposed by the first opening is selectively removed. A second gate pattern is formed across the second active region. Low concentration source/ drain regions are formed in the second active region located on both sides of the second gate pattern. Spacers are formed on sidewalls of the second opening and on sidewalls of the second gate pattern. Also, a spacer layer pattern filling the first opening is concurrently formed with the spacers. High concentration source/drain regions adjacent the low concentration source/drain regions are formed in the second active region to provide LDD-type source/drain regions including the low concentration source/drain regions and the high concentration source/drain regions. The spacers are then removed to expose the sidewalls of the second opening and the second gate pattern. During removal of the spacers, a recessed spacer layer pattern remains in the first opening.

In some embodiments, a first impurity region having a line-shaped configuration may be formed at the surface of the semiconductor substrate exposed by the first opening, prior to formation of the second gate pattern. Then, a second impurity region having an island-shaped configuration may be formed at the surface of the first active region exposed by the second opening. Alternatively, the first and second impurity regions can be concurrently formed using a single step ion implantation process.

In accordance with another embodiment, the semiconductor integrated circuit includes a device isolation layer formed at a semiconductor substrate to define first and second active regions. A plurality of first gate patterns extend across the first active region. The regions between the first gate patterns include a first opening having a first width and a second opening having a second width greater than the first width. A second gate pattern extends across the second active region. The first opening is filled with a recessed spacer layer pattern. LDD-type source/drain regions are formed in the second active region located on both sides of the second gate pattern.

In some embodiments, a first impurity region having a line-shaped configuration may be disposed at the surface of the semiconductor substrate underneath the first opening. Also, a second impurity region having an island-shaped configuration may be disposed at the surface of the first active region underneath the second opening. As a result, the first impurity region is covered with the recessed spacer layer pattern.

In accordance with one embodiment, the method of manufacturing a flash memory device includes providing a semiconductor substrate having a cell array region and a peripheral circuit region. A device isolation layer is formed at a predetermined region of the semiconductor substrate to define a cell active region and a peripheral circuit active region in the cell array region and the peripheral circuit region respectively. A stacked gate layer and a peripheral circuit gate layer are then formed in the cell array region and the peripheral circuit region respectively. The stacked gate layer is patterned to form a plurality of stacked gate patterns that extend across the cell active region. The regions between the stacked gate patterns include first openings having a first width and second openings having a second width greater than the first width. The device isolation layer exposed by the first openings is selectively removed. The peripheral circuit gate layer is patterned to form a peripheral circuit gate electrode that extends across the peripheral circuit active region. Impurity ions are implanted into the peripheral circuit active region using the peripheral circuit gate electrode as an ion implantation mask. As a result, low concentration source/drain regions are formed at the peripheral circuit active region. Spacers are formed on the sidewalls of the second openings and on sidewalls of the peripheral circuit gate electrode. Spacer layer patterns filling the first openings are concurrently formed with the spacers. High concentration source/drain regions are formed at the peripheral circuit active region using the peripheral circuit gate electrode and the spacers on the sidewall of the peripheral circuit gate electrode as ion implantation masks to provide LDD-type source/drain regions including the low concentration source/drain regions and the high concentration source/drain regions. The spacers are removed to expose the sidewalls of the second openings and the peripheral circuit gate electrode. During removal of the spacers, recessed spacer layer patterns remain in the first openings.

In some embodiments, before forming the peripheral circuit gate electrode, line-shaped common source regions and island-shaped drain regions may be formed at the surface of the semiconductor substrate exposed by the first openings and at the surface of the cell active region exposed by the second openings respectively. As a result, the common source regions are covered with the spacer layer patterns.

In accordance with another embodiment, the flash memory device includes a semiconductor substrate having a cell array region and a peripheral circuit region. A device isolation layer is formed at a predetermined region of the semiconductor substrate. The device isolation layer defines a cell active region and a peripheral circuit active region in the cell array region and the peripheral circuit region, respectively. A plurality of stacked gate patterns extend across the cell active region. The regions between the stacked gate patterns include first openings having a first width and second openings having a second width greater than the first width. A peripheral circuit gate electrode extends across the peripheral circuit active region. The first openings are filled with recessed spacer layer patterns. LDD-type source/drain regions are disposed at the peripheral circuit active region located on both sides of the peripheral circuit gate electrode.

According to still another embodiment, line-shaped common source regions may be disposed at the surface of the semiconductor substrate underneath the first openings. Also, island-shaped drain regions may be disposed at the surface of the cell active region underneath the second openings. As a result, the common source regions are covered with the recessed spacer layer patterns.

BRIEF DESCRIPTION OF THE DRAWINGS

Exemplary embodiments of the present invention will be readily apparent to those of ordinary skill in the art upon review of the detailed description that follows when taken in conjunction with the accompanying drawings, in which like reference numerals denote like elements, and in which:

FIGS. 2A to 14A are sectional views, taken along line I–I' of FIG. 1, illustrating a fabrication method of a semiconductor integrated circuit according to an embodiment of the present invention;

FIGS. 2B to 14B are sectional views, taken along line II–II' of FIG. 1, illustrating a fabrication method of a semiconductor integrated circuit according to an embodiment of the present invention;

FIGS. 2C to 14C are sectional views, taken along line III–III' of FIG. 1, illustrating a fabrication method of a semiconductor integrated circuit according to an embodiment of the present invention; and FIGS. 2D to 14D are sectional views, taken along line IV–IV' of FIG. 1, illustrating a fabrication method of a semiconductor integrated circuit according to an embodiment of the present invention.

DETAILED DESCRIPTION OF EXEMPLARY EMBODIMENTS

Figure 1:
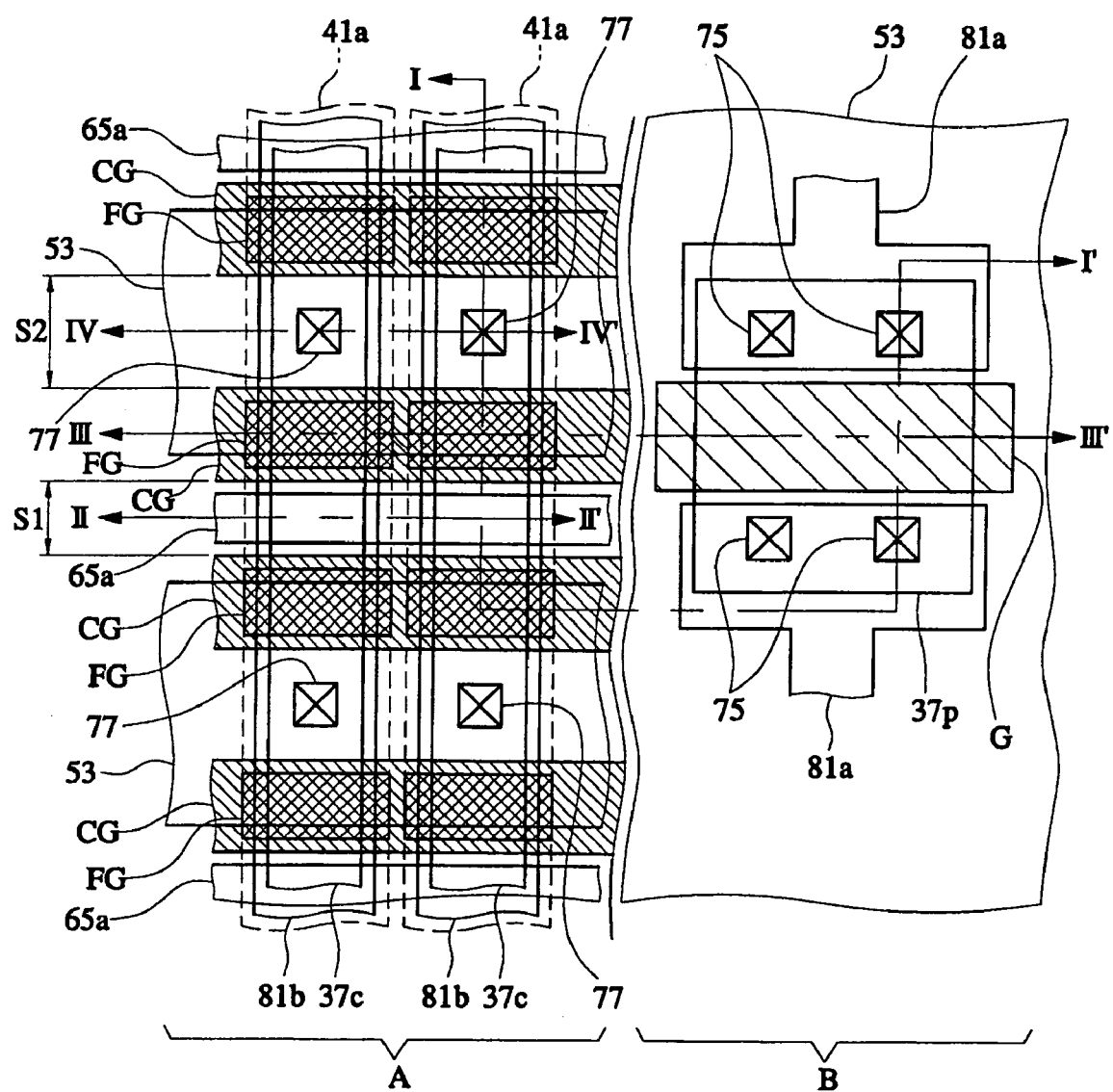
FIG. 1 is a top plan view illustrating a semiconductor integrated circuit according to the present invention.
Figure 2A:
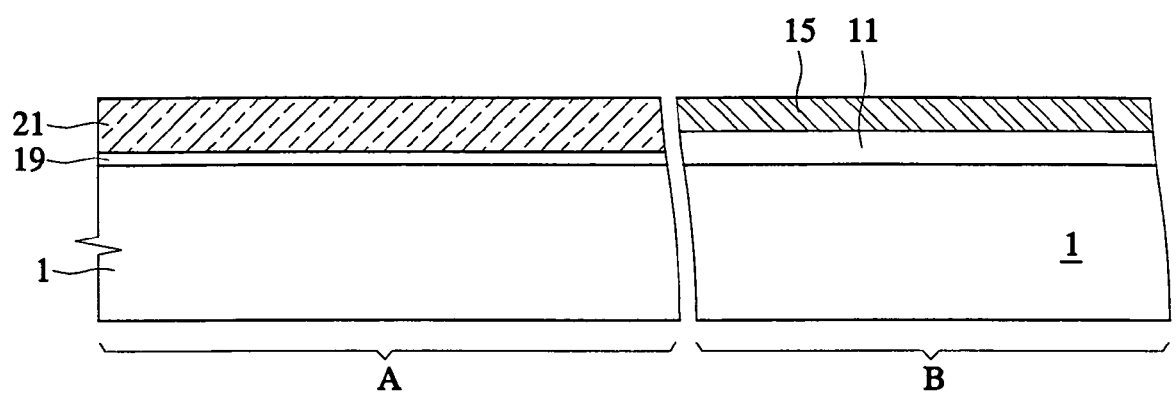
Figure 2B:
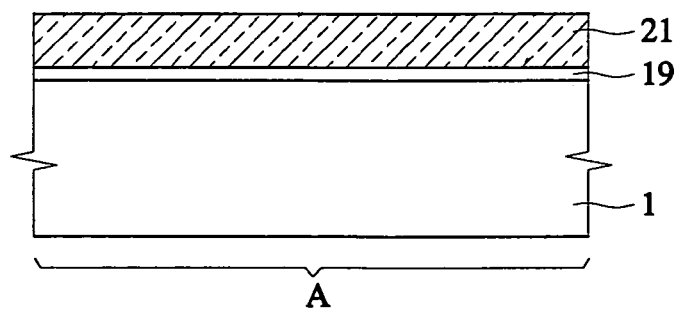
Figure 2C:
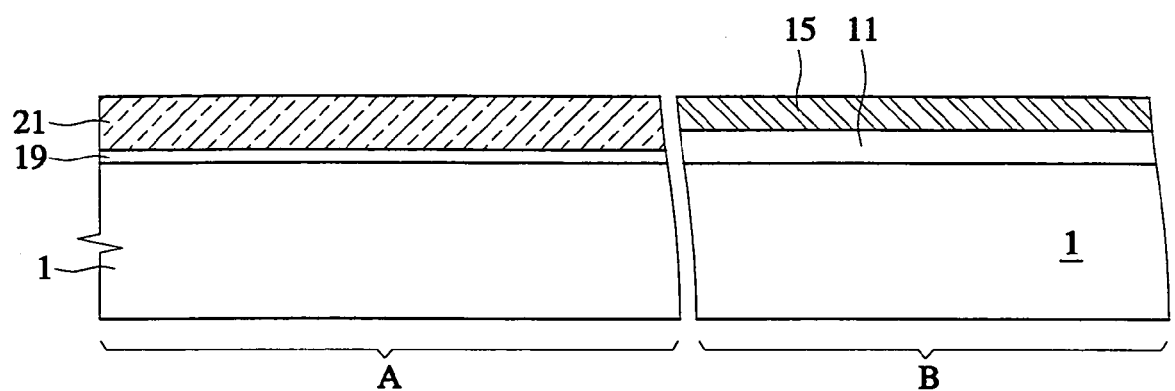
Figure 2D:
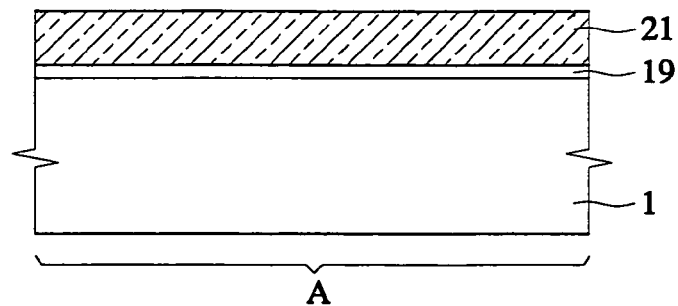
Figure 3A:
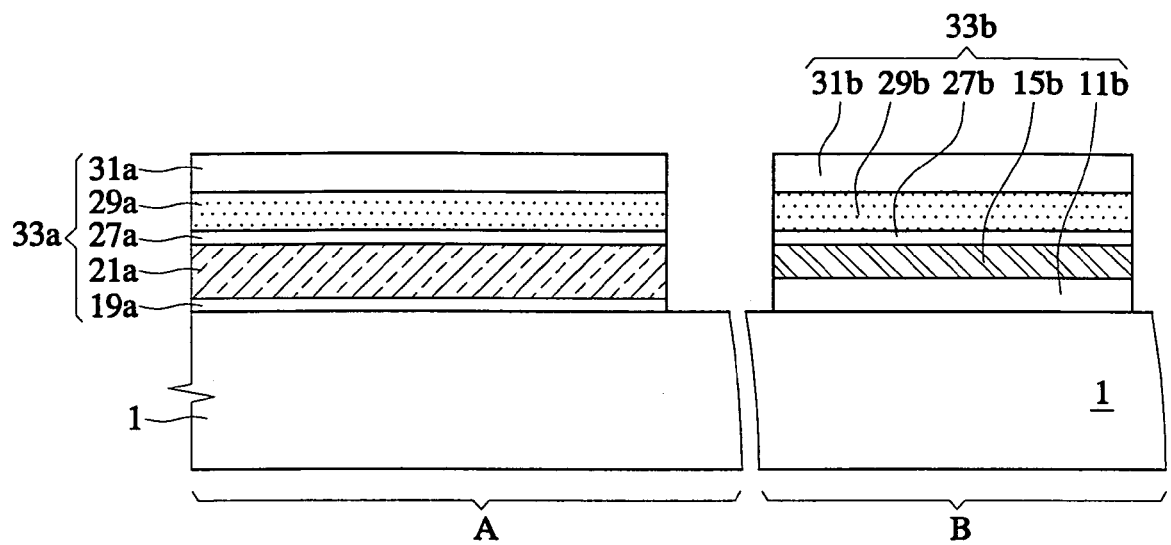
Figure 3B:
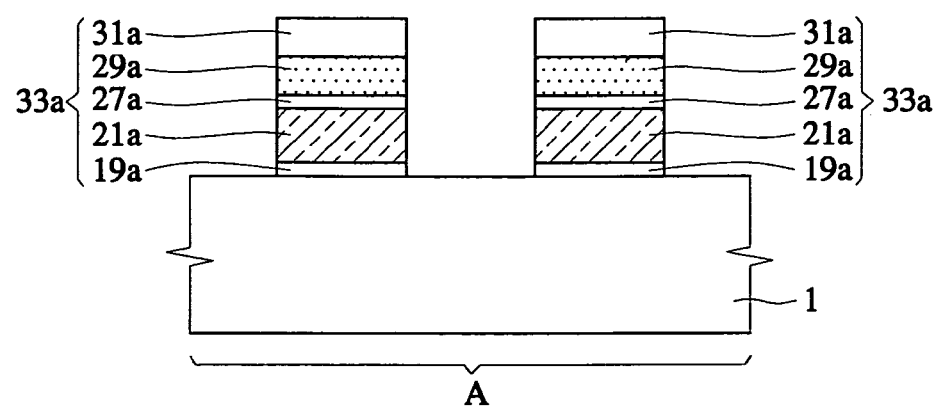
Figure 3C:
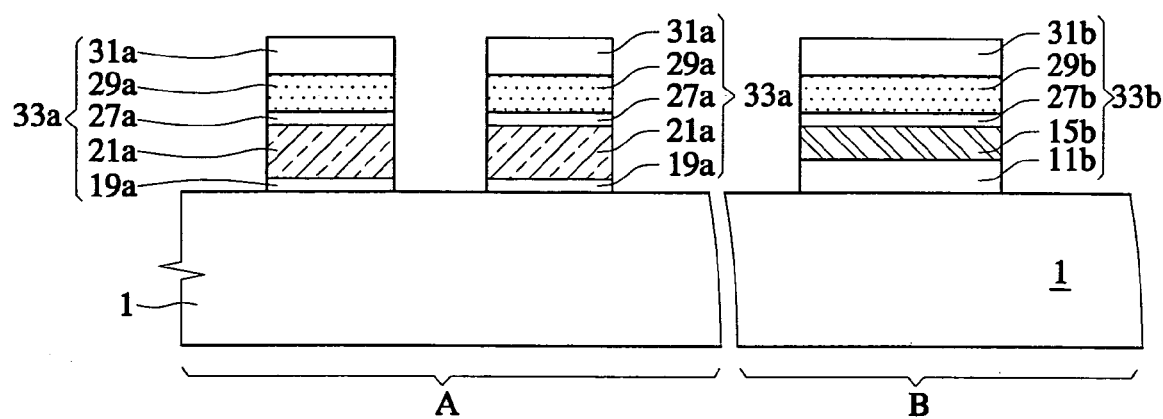
Figure 3D:
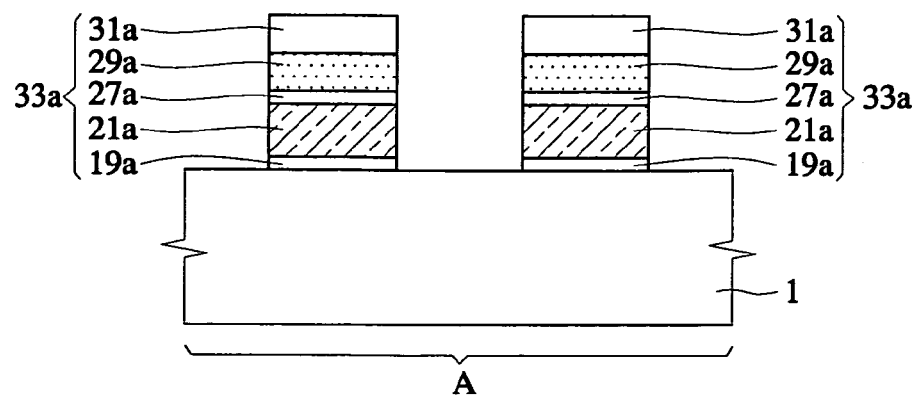
Figure 4A:
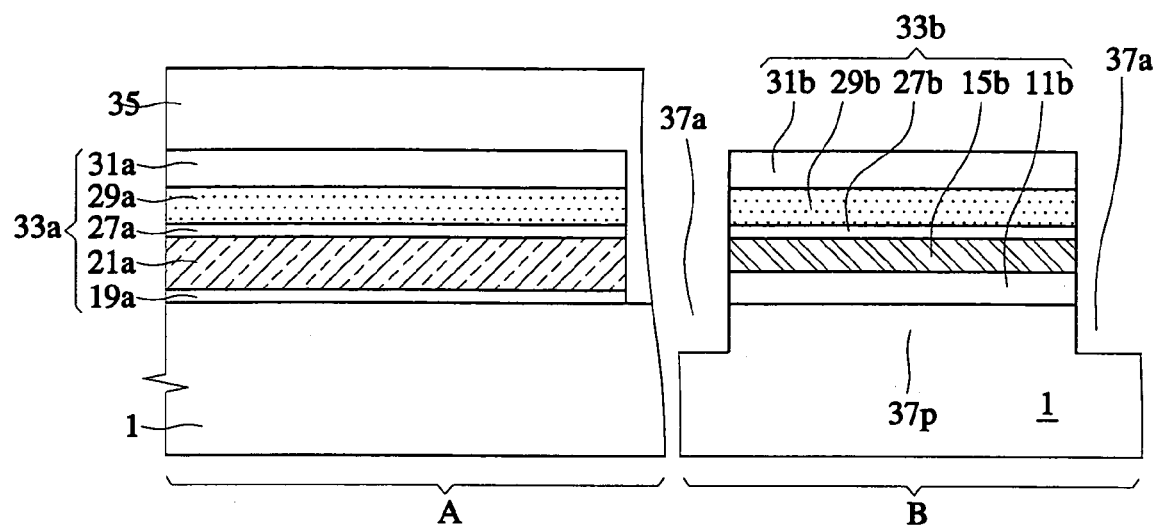
Figure 4B:
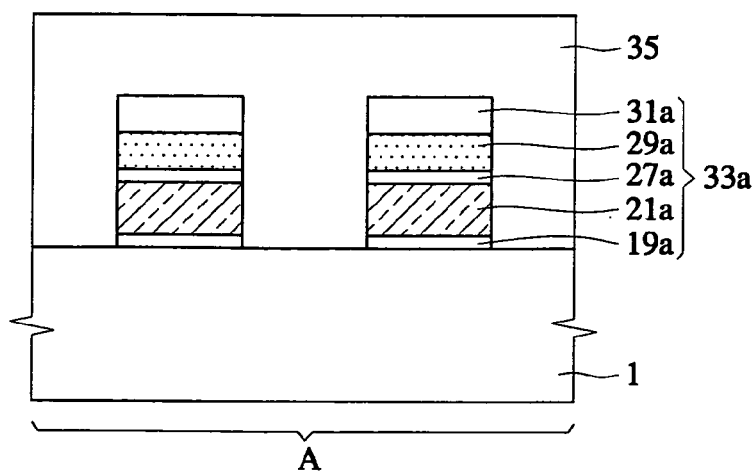
Figure 4C:
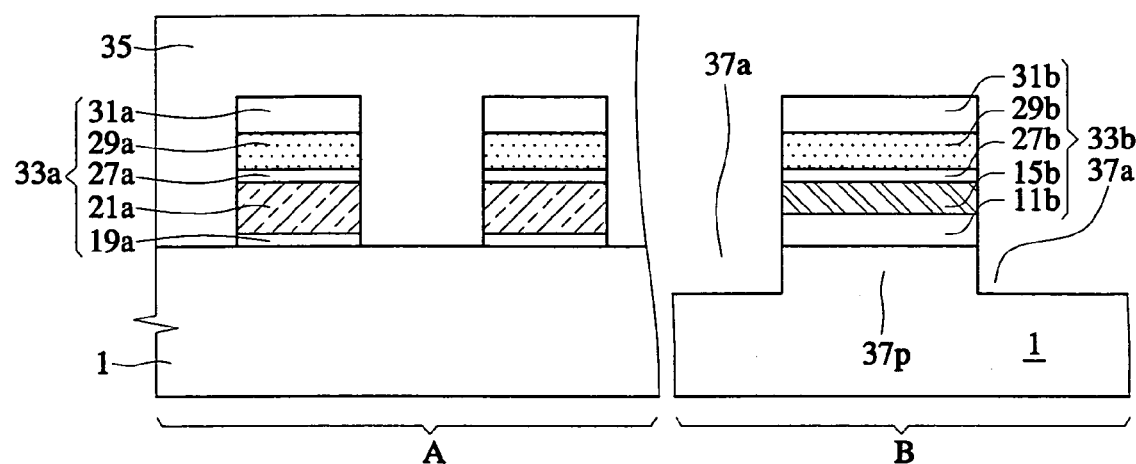
Figure 4D:
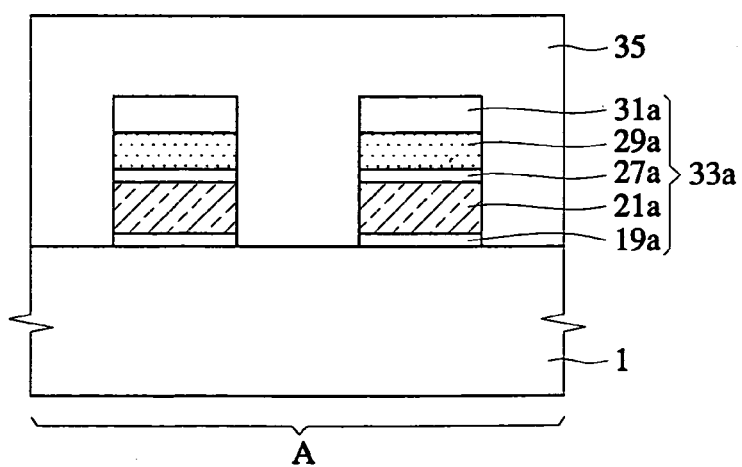
Figure 5A:
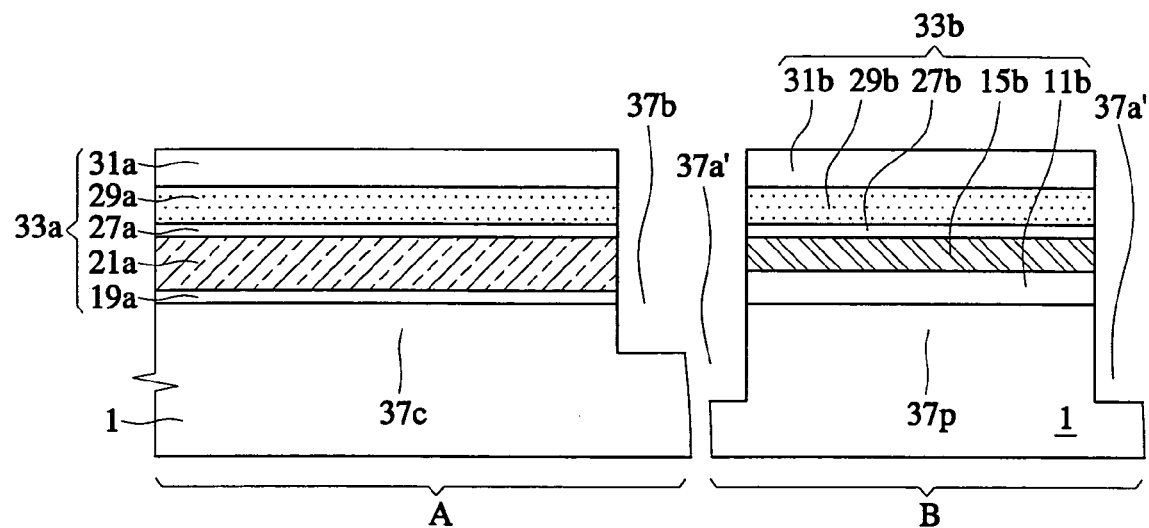
Figure 5B:
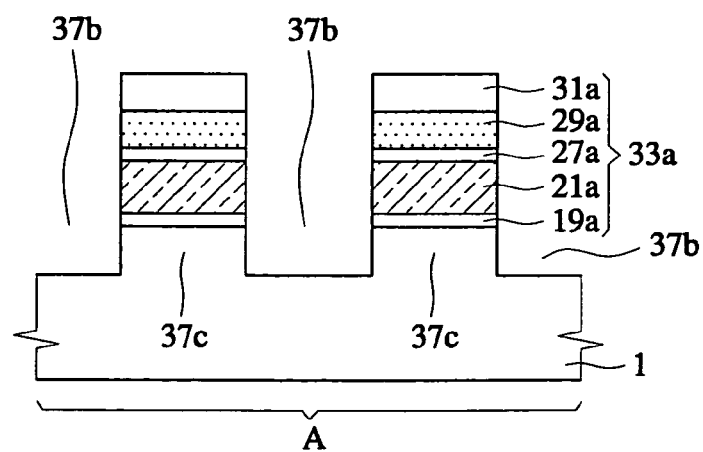
Figure 5C:
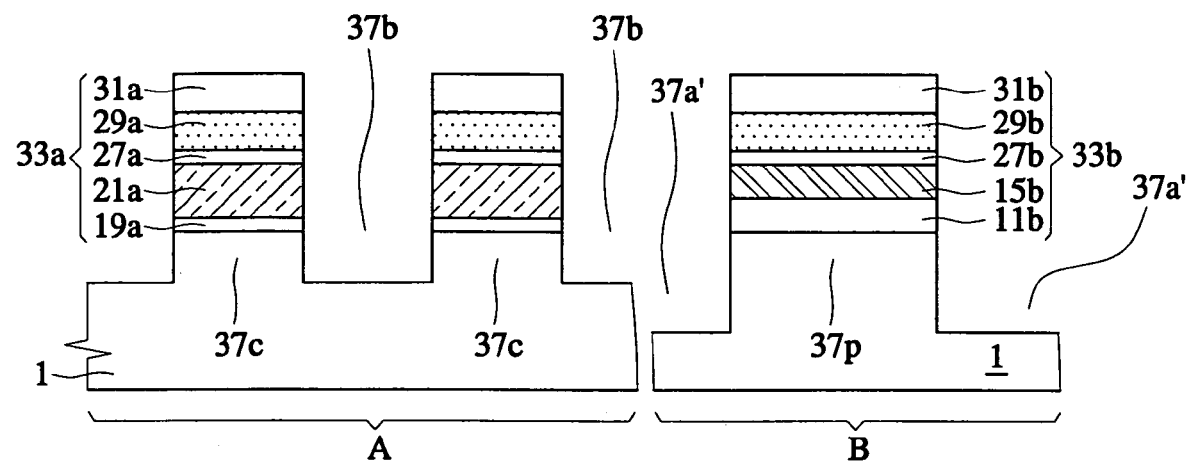
Figure 5D:
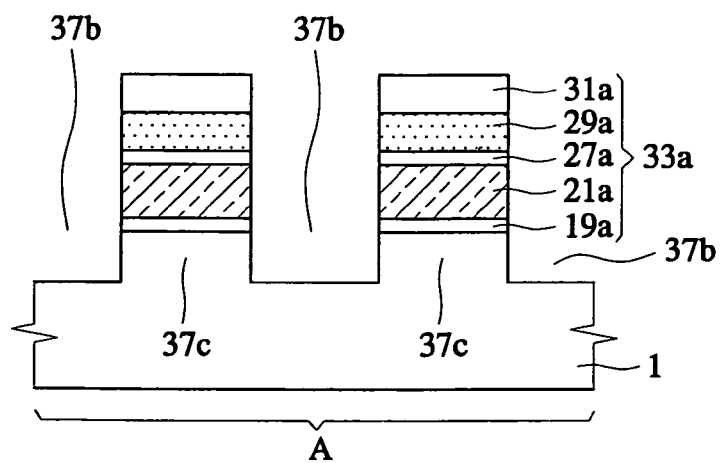
Figure 6A:
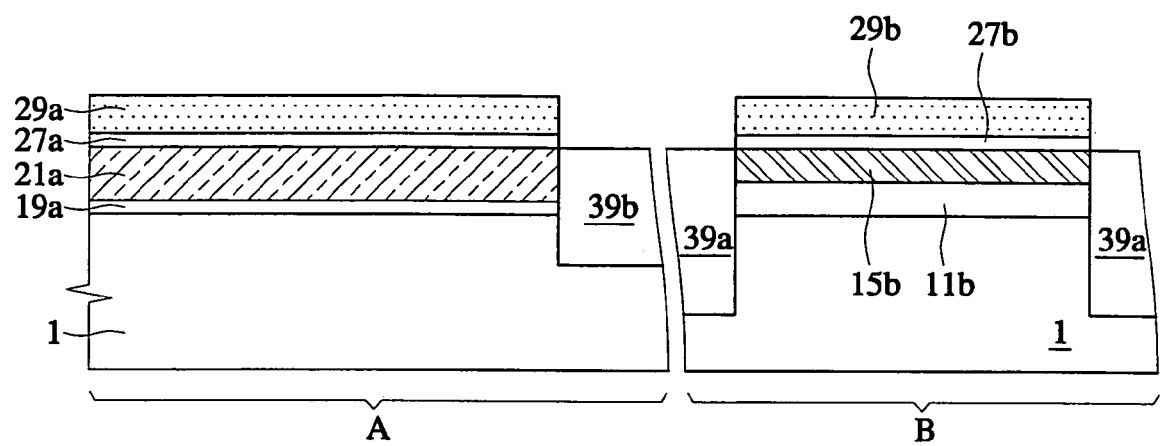
Figure 6B:
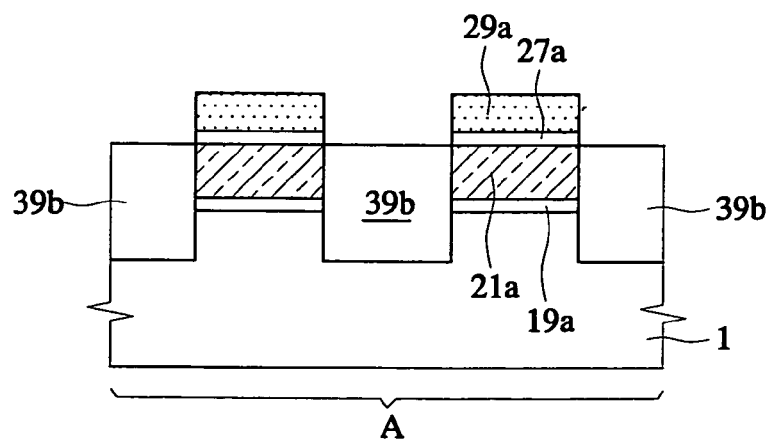
Figure 6C:
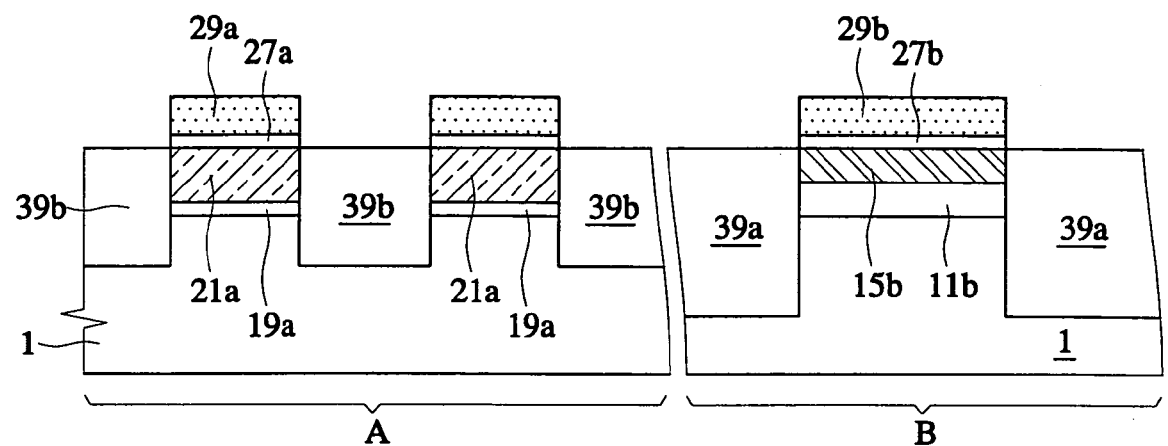
Figure 6D:
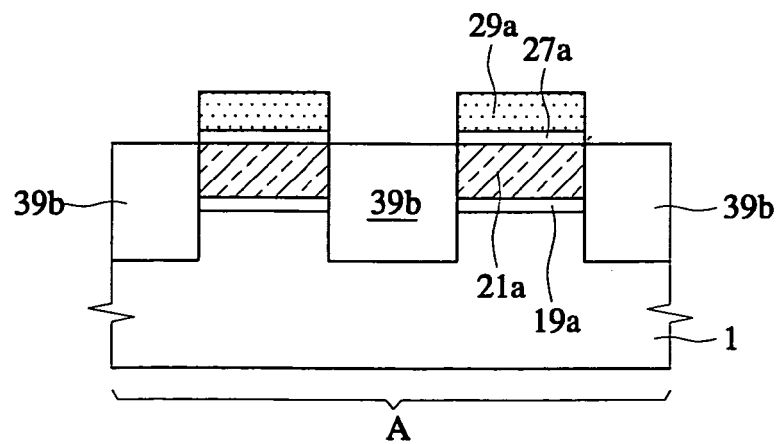
Figure 7A:
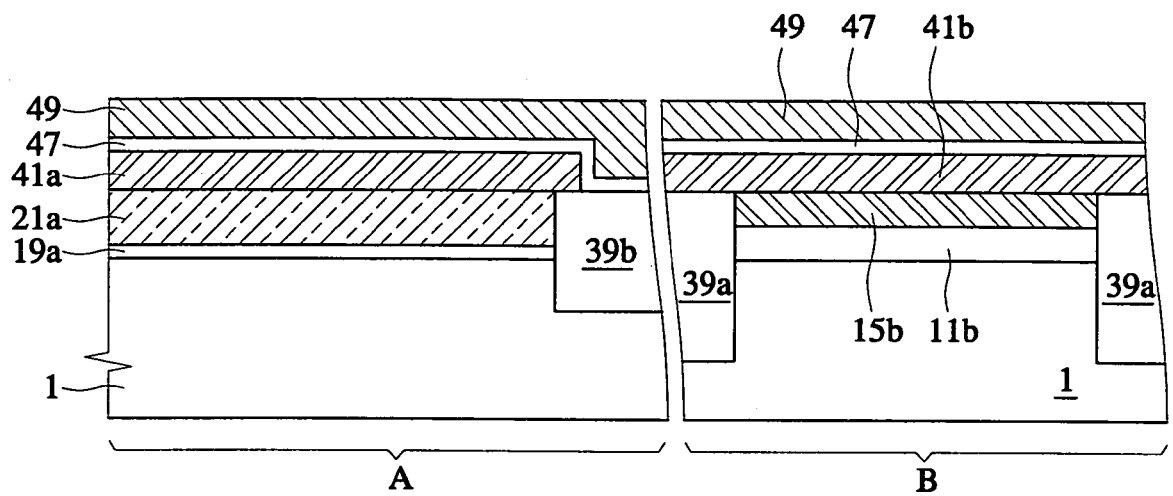
Figure 7B:
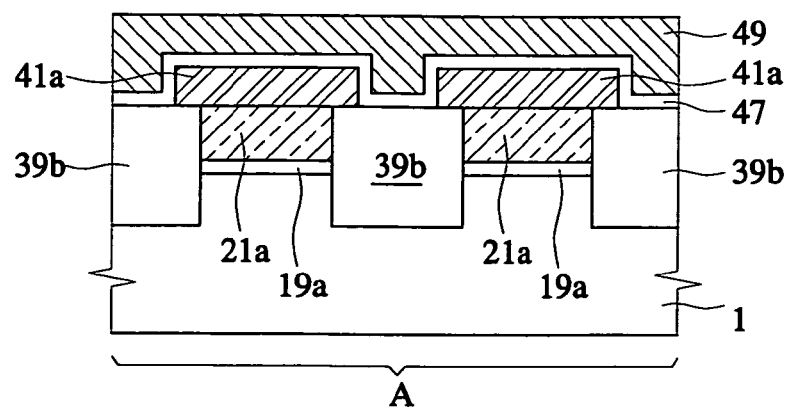
Figure 7C:
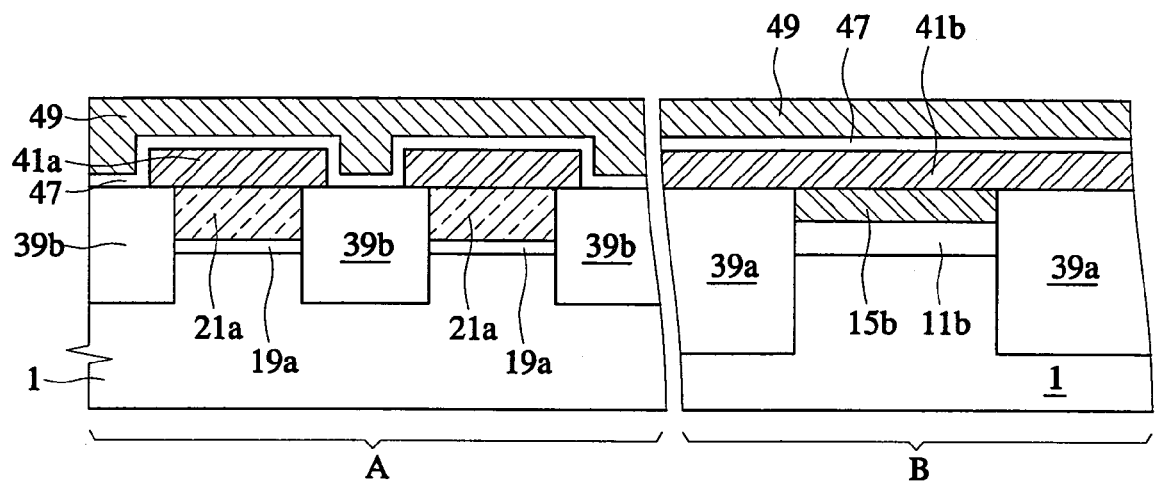
Figure 7D:
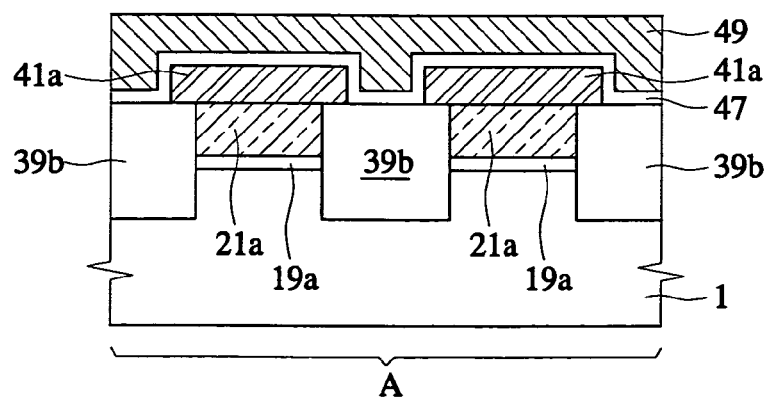
Figure 8A:
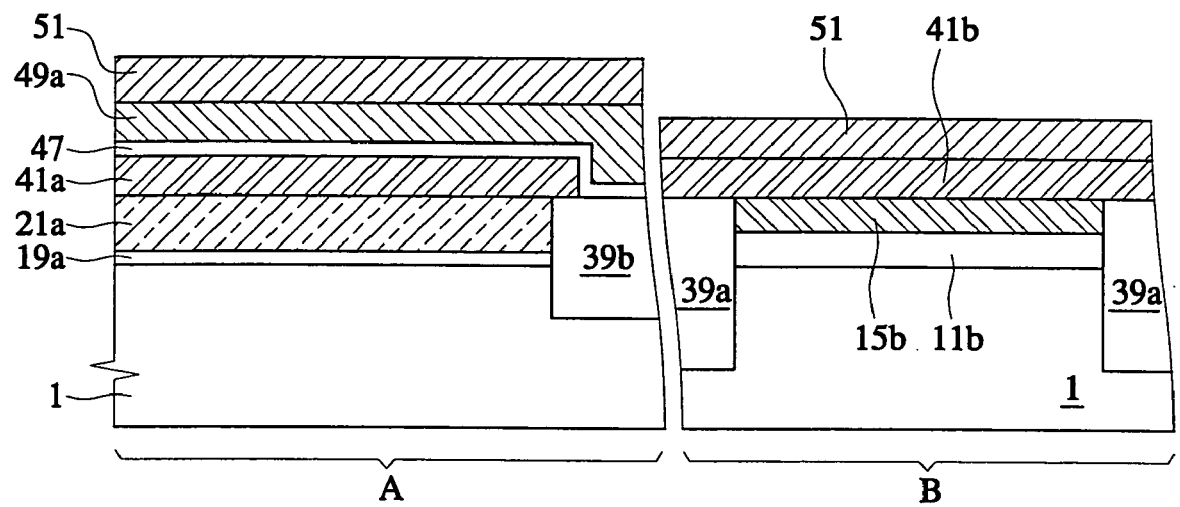
Figure 8B:
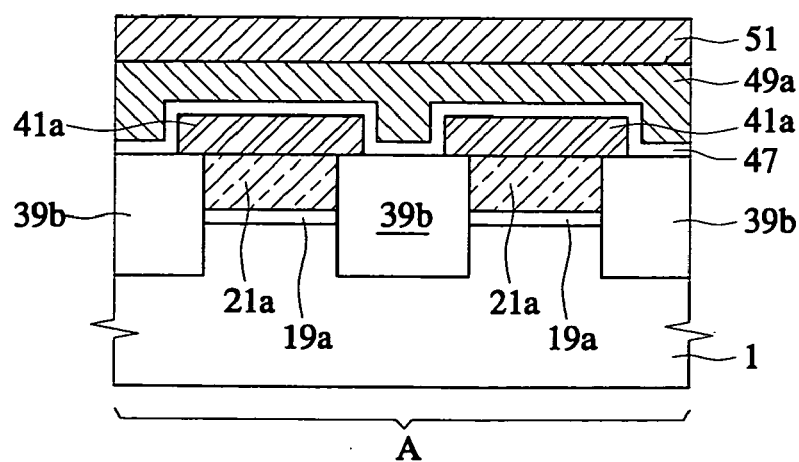
Figure 8C:
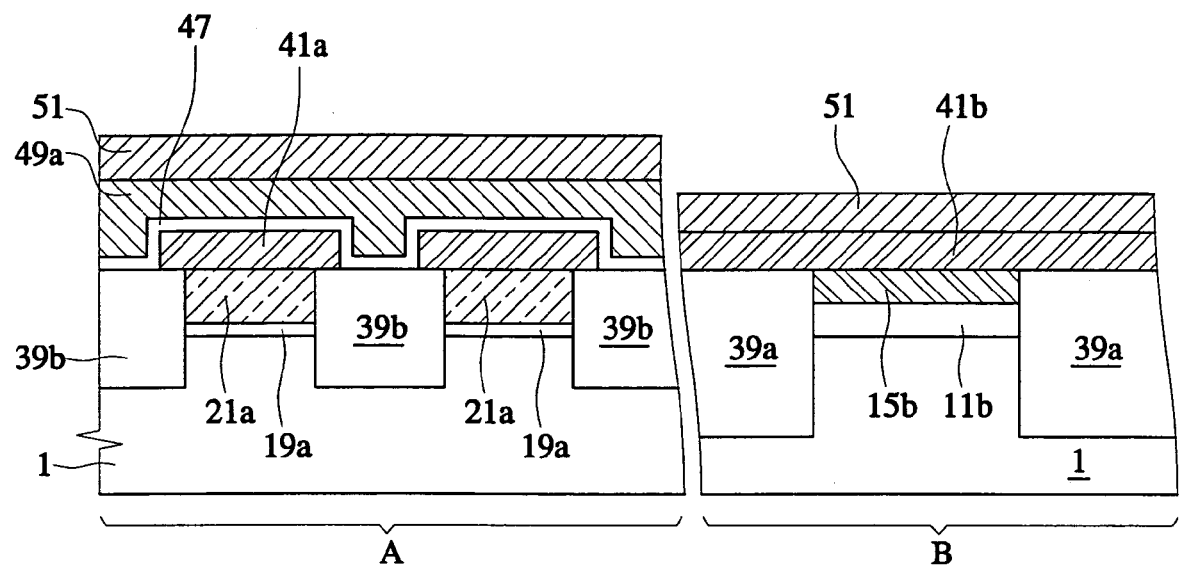
Figure 8D:
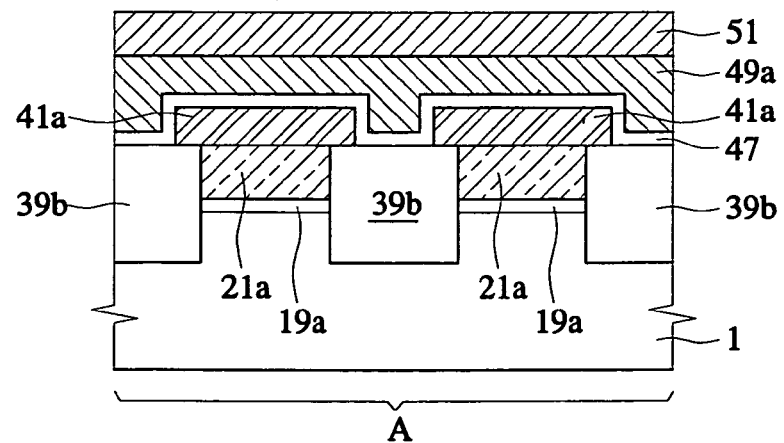
Figure 9A:
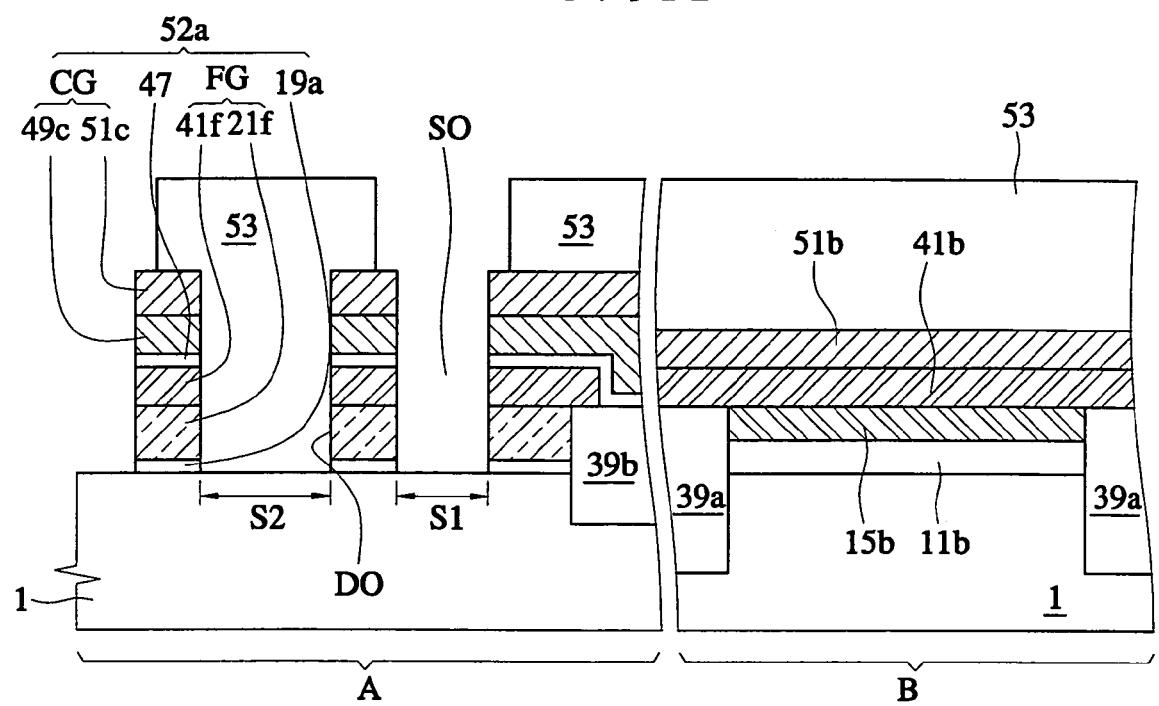
Figure 9B:
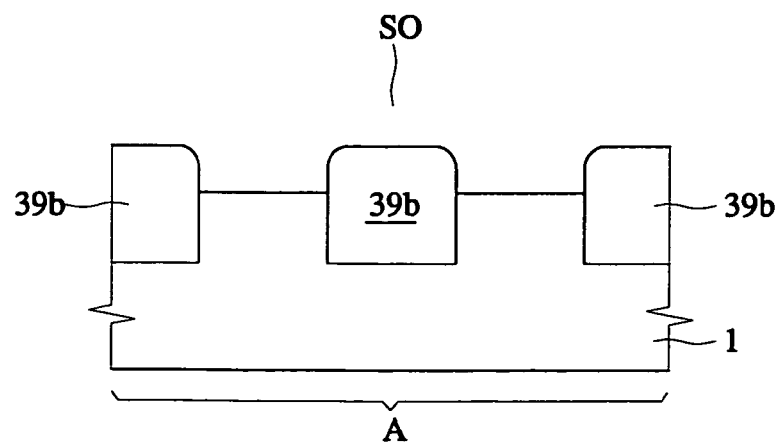
Figure 9C:
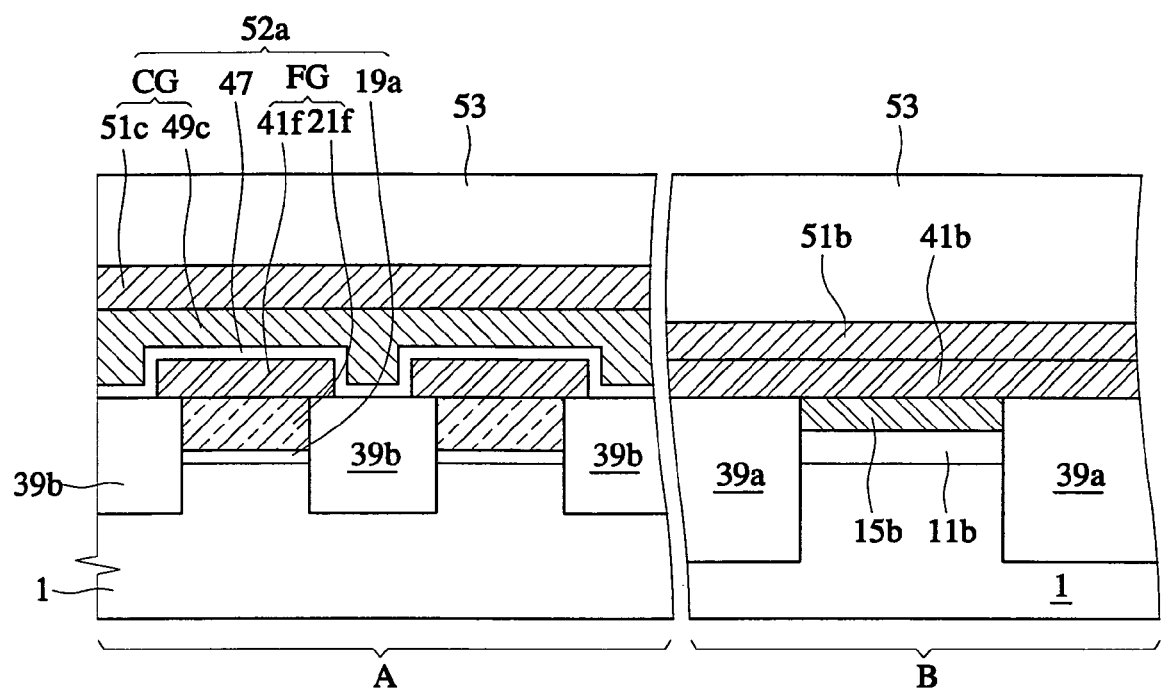
Figure 9D:
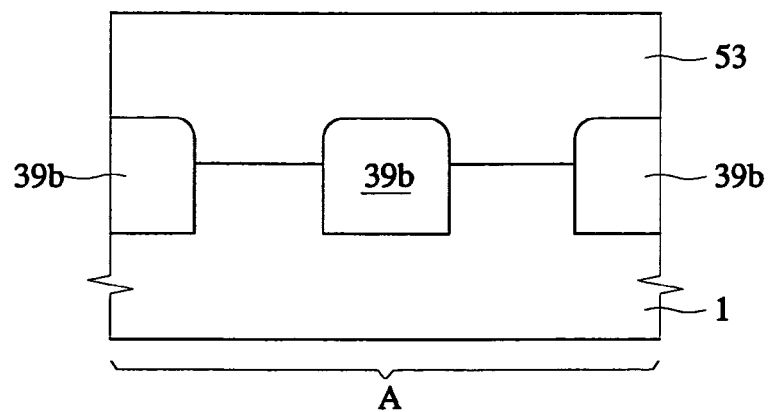

The present invention will now be described more fully hereinafter in conjunction with a NOR-type flash memory device with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. For example, the present invention may be applied to NAND-type flash memory devices within spirit and scope of the invention. In the drawings, the thickness of layers and regions are exaggerated for clarity. Like reference numerals refer to like elements throughout the specification.

FIG. 1 is a top plan view of a NOR flash memory device according to an embodiment of the present invention, and FIGS. 14A, 14B, 14C and 14D are sectional views taken along lines I–I', II–II', III–III' and IV–IV' of FIG. 1, respectively.

Referring to FIGS. 1, 14A, 14B, 14C and 14D, a semiconductor substrate 1 has a cell array region A and a peripheral circuit region B surrounding the cell array region A. The peripheral circuit region B may correspond to a high voltage MOS transistor region or a low voltage MOS transistor region. In this embodiment, for simplicity, it is assumed that the peripheral circuit region B is an NMOS transistor region. A device isolation layer is located at a predetermined region of the semiconductor substrate 1. The device isolation layer defines first and second active regions in the cell array region A and the peripheral circuit region B, respectively.

In more detail, the device isolation layer defines cell active regions 37c (FIG. 1) and a peripheral circuit active region 37p (FIG. 1) in the cell array region A and the peripheral circuit region B, respectively. Preferably, the device isolation layer includes a cell device isolation layer 39b (FIG. 14A) formed in the cell array region A and a peripheral circuit device isolation layer 39a (FIG. 14A) formed in the peripheral circuit region B. In this case, the cell device isolation layer 39b is preferably thinner than the peripheral circuit device isolation layer 39a.

Figure 14A:
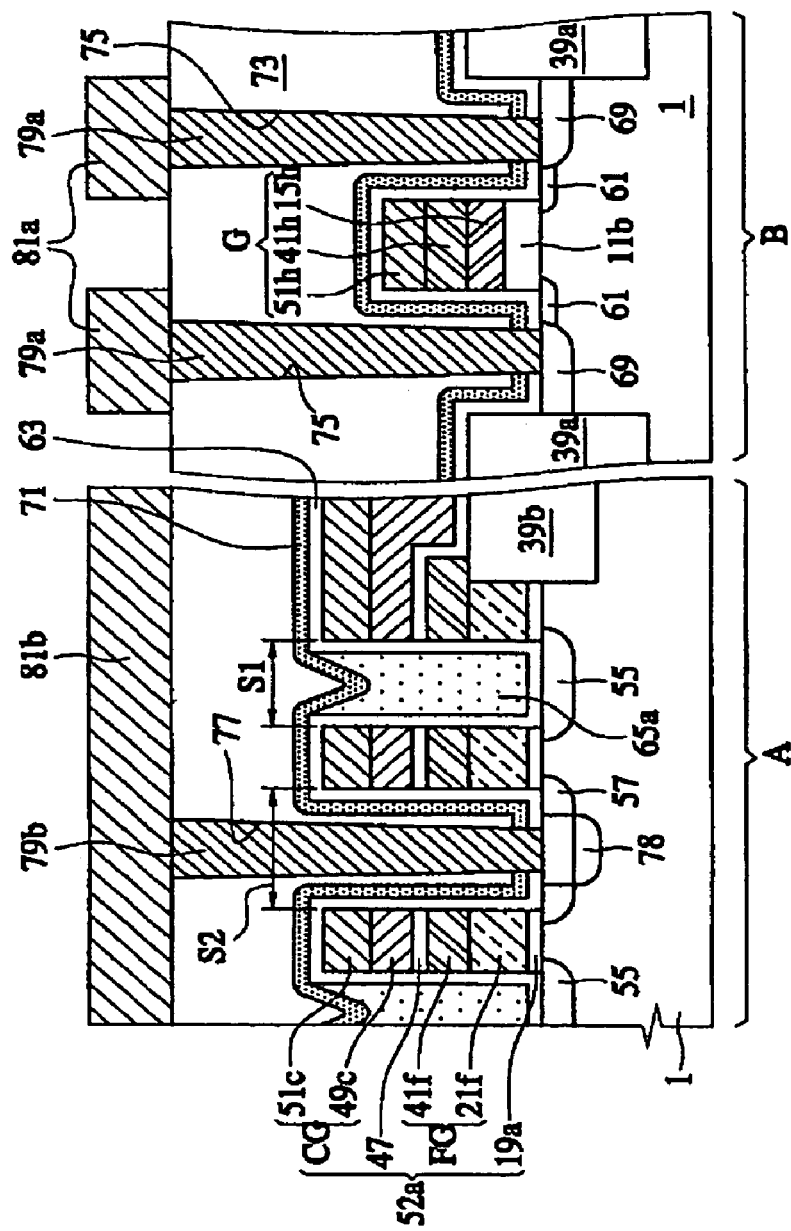
Figure 14B:
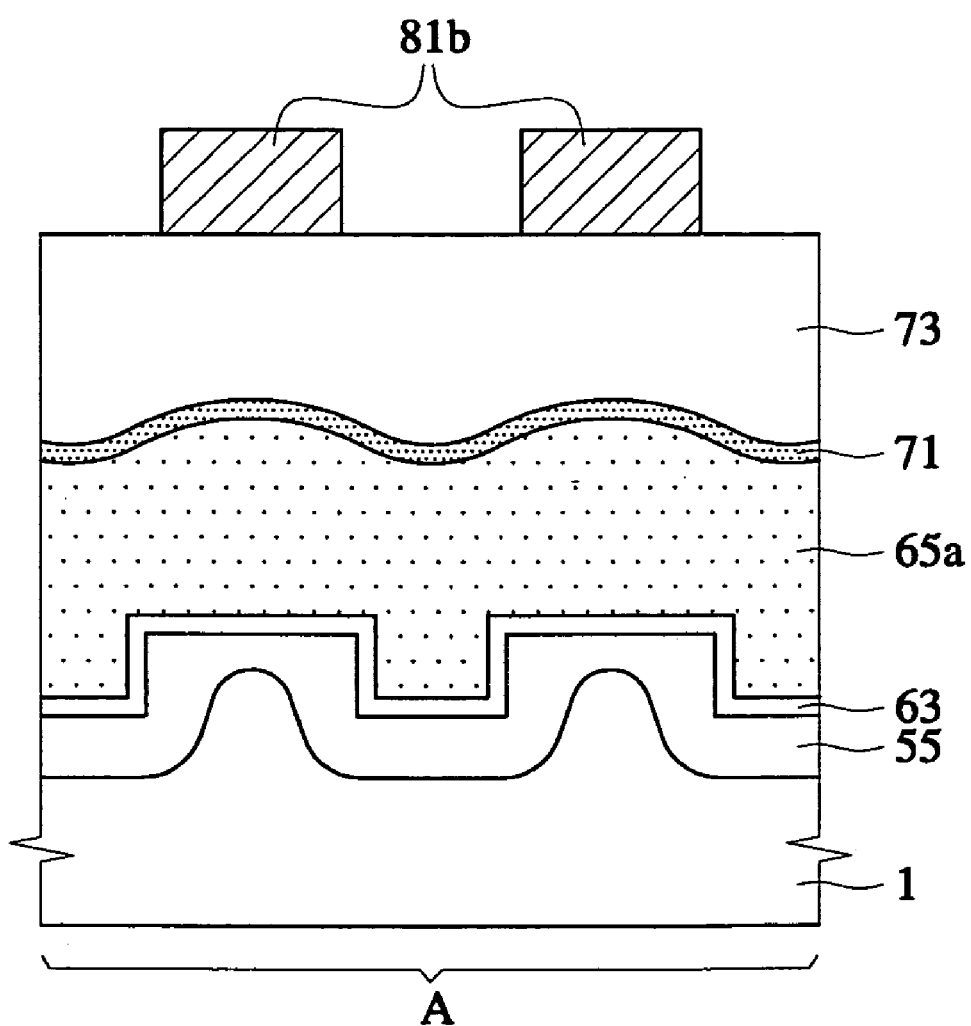
Figure 14C:
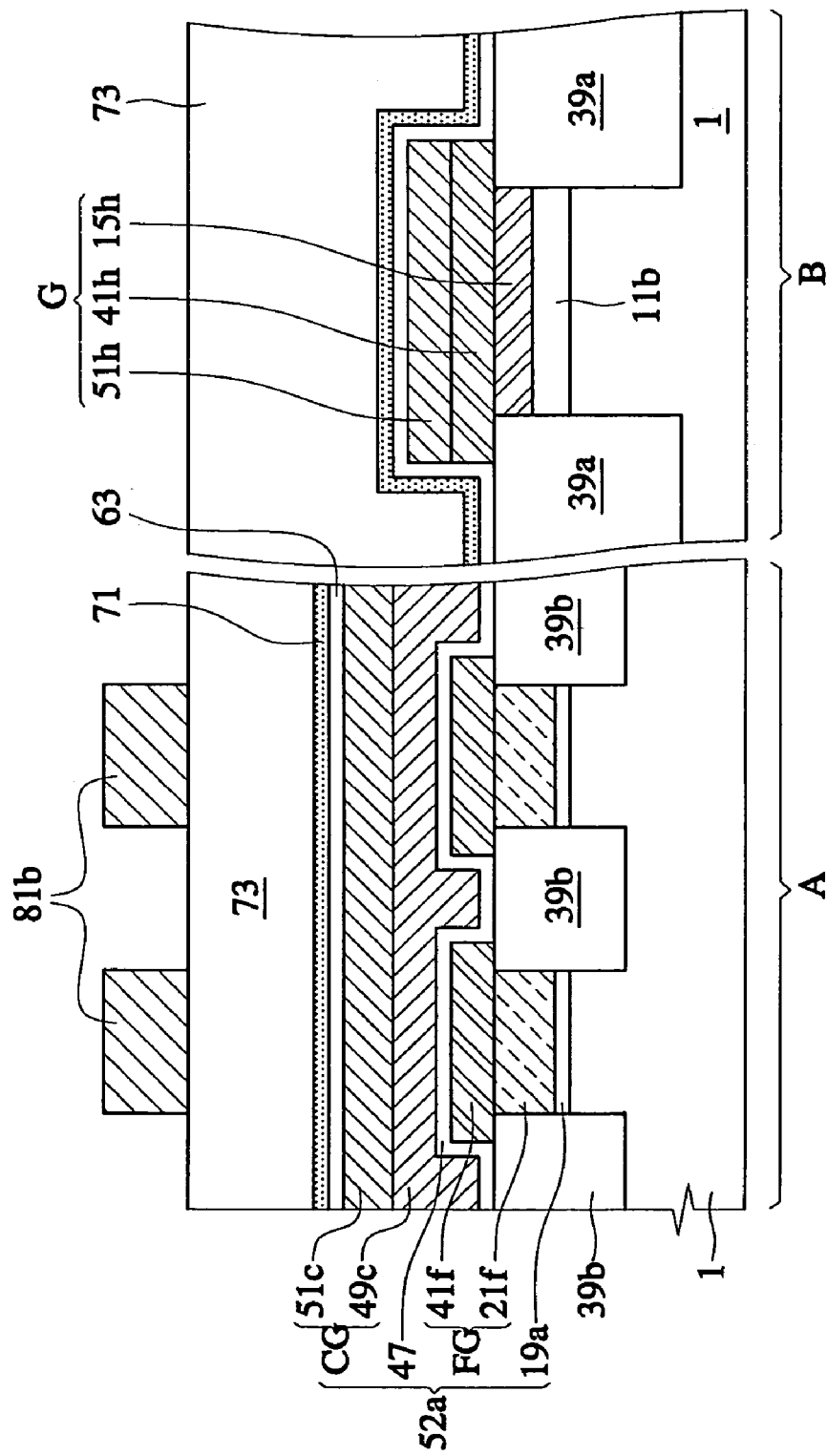
Figure 14D:
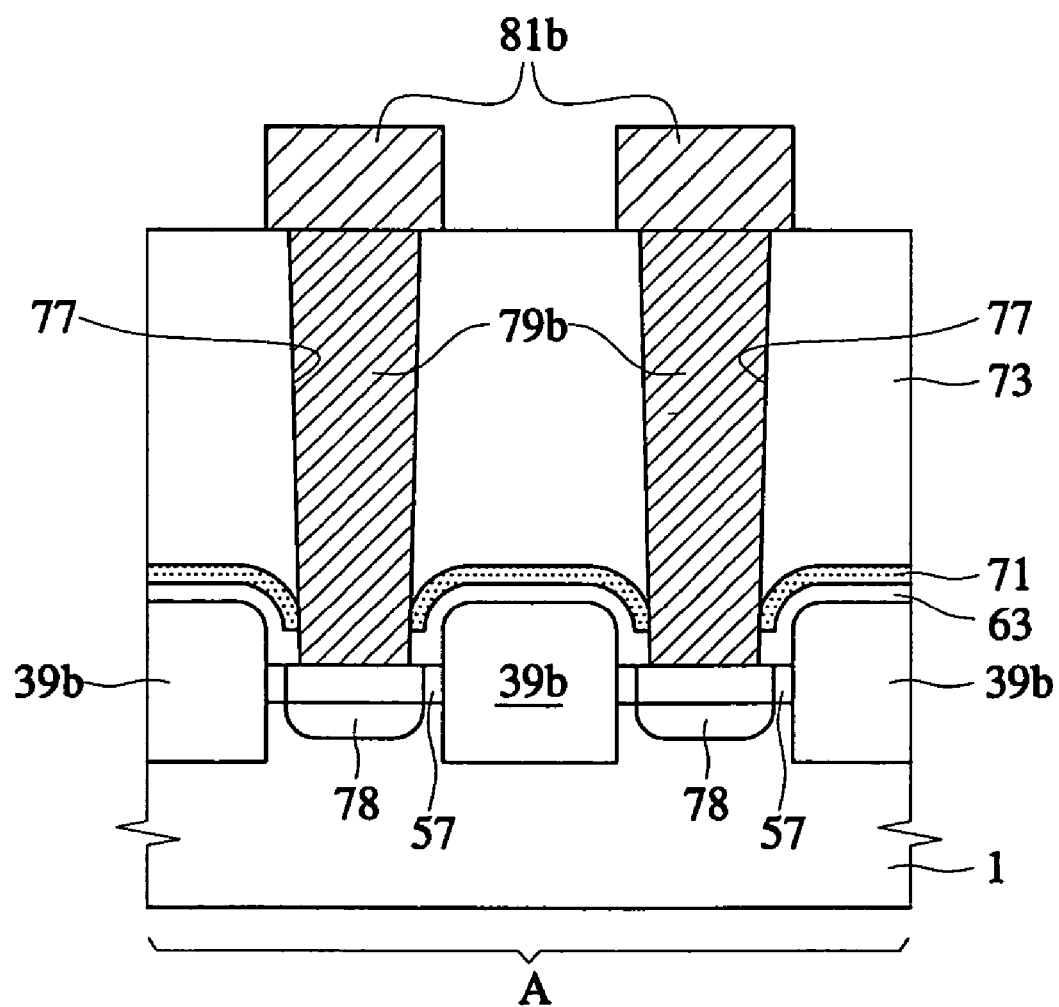

As shown in FIGS. 1 and 14c, a plurality of first gate patterns 52a, e.g., a plurality of stacked gate patterns, extend across the cell active regions 37c. Each of the stacked gate patterns 52a includes a tunnel insulating layer pattern such as a tunnel oxide layer pattern 19a, a floating gate FG, an inter-gate dielectric layer 47 and a control gate electrode CG, which are sequentially stacked. The control gate electrodes CG extend across the cell active regions 37c and the cell device isolation layer 39b between the cell active regions 37c. Further, the floating gates FG are located between the control gate electrodes CG and the cell active regions 37c. Each of the control gate electrodes CG may include first and second control gate electrodes 49c and 51c, which are sequentially stacked, and each of the floating gates FG may include a lower floating gate 21f and an upper floating gate 41f, which are sequentially stacked.

On the other hand, as shown in FIG. 1, the regions between the stacked gate patterns 52a define first spaces having a first width S1 and second spaces having a second width S2 greater than the first width S1.

Referring to FIG. 14A, the first spaces are filled with recessed spacer layer patterns 65a. First impurity regions 55 having a line shape, e.g., common source regions are formed at the surface of the semiconductor substrate under the recessed spacer layer patterns 65a. As a result, the common source regions 55 are covered with the recessed spacer layer patterns 65a. In this case, as shown in FIG. 14B, the recessed spacer layer patterns 65a also fill the regions where the cell device isolation layer between the cell active regions 37c is removed. In addition, second impurity regions 57 having an island shape, e.g., drain regions are formed at the surfaces of the cell active regions 37c under the second spaces.

Figure 12A:
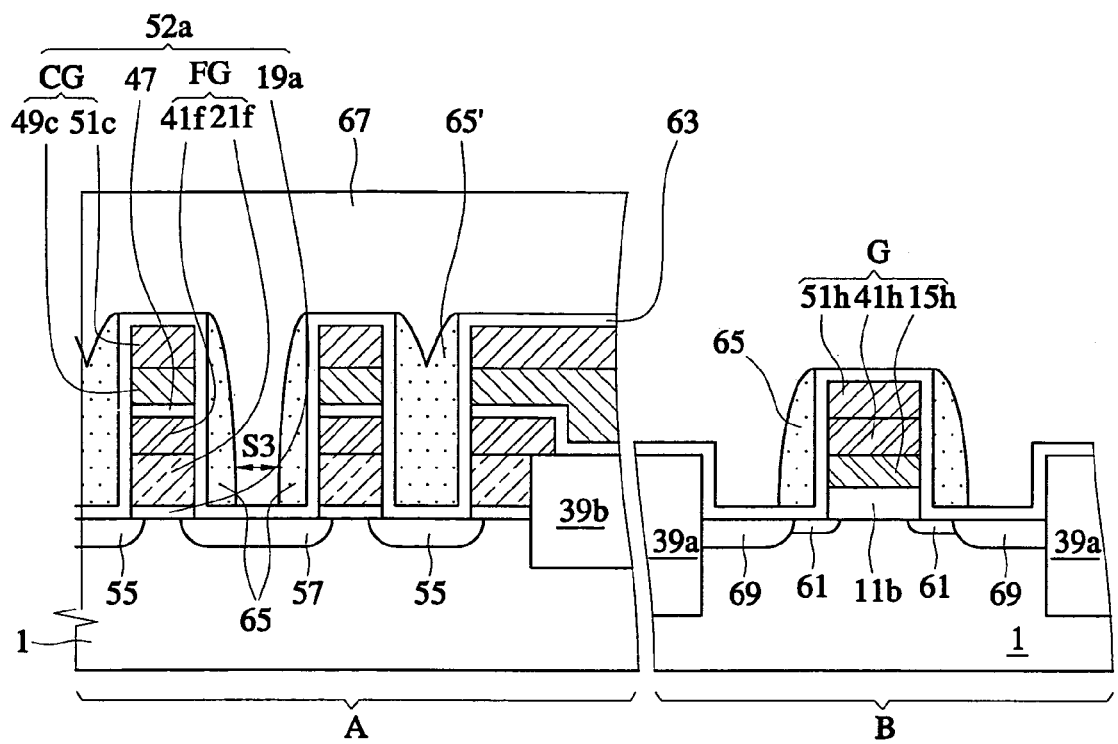
Figure 12B:
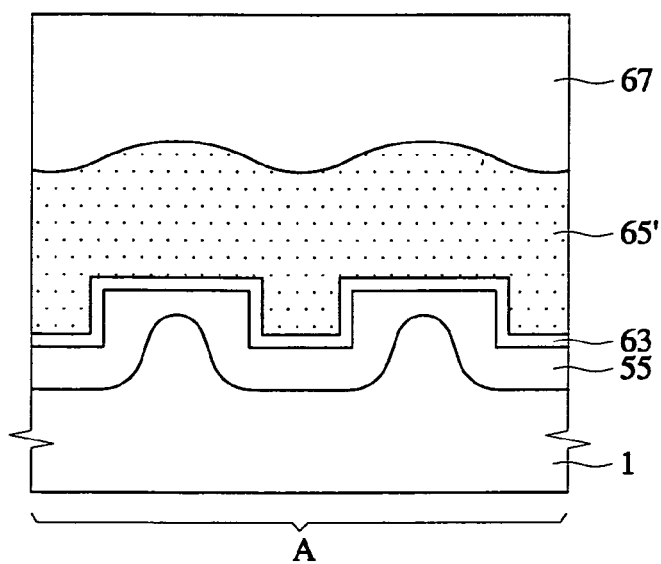
Figure 12C:
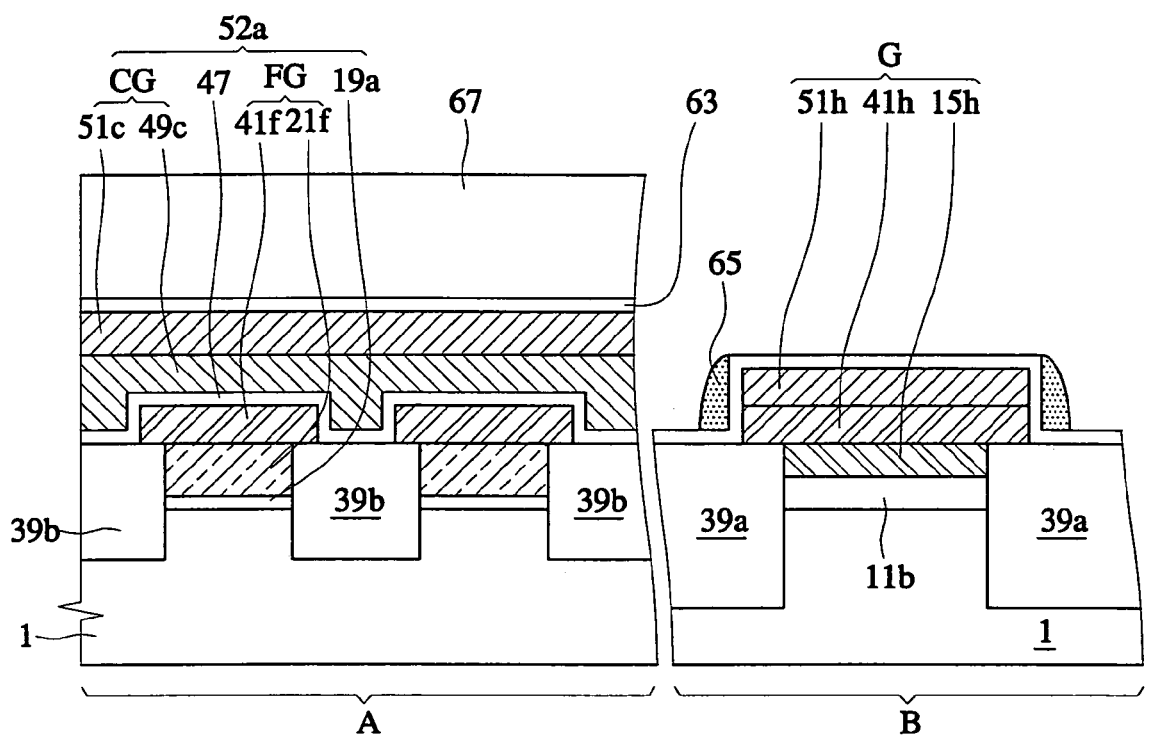
Figure 12D:
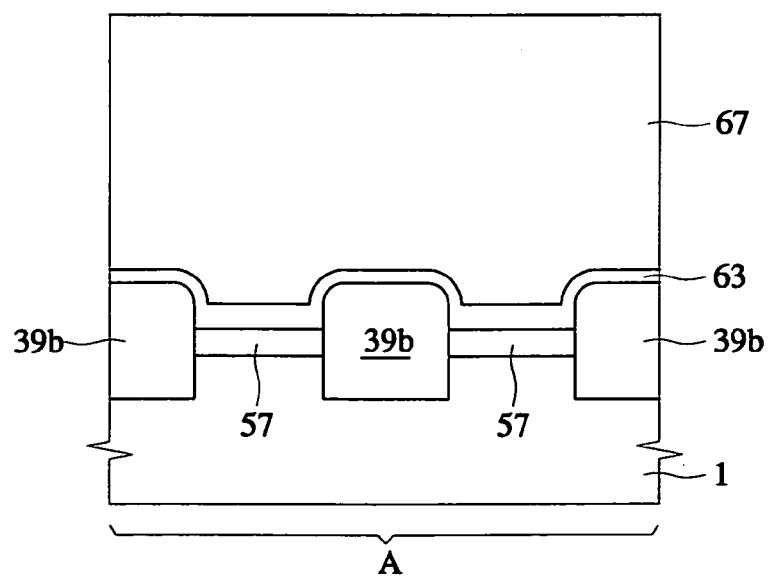
Figure 13A:
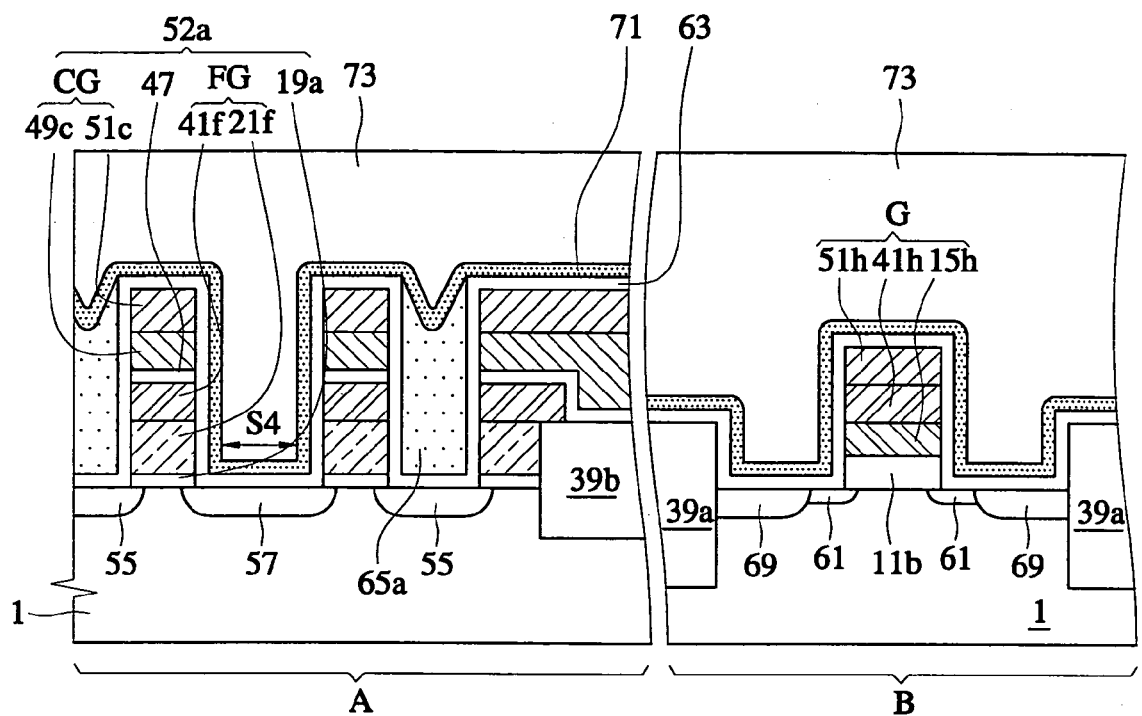
Figure 13B:
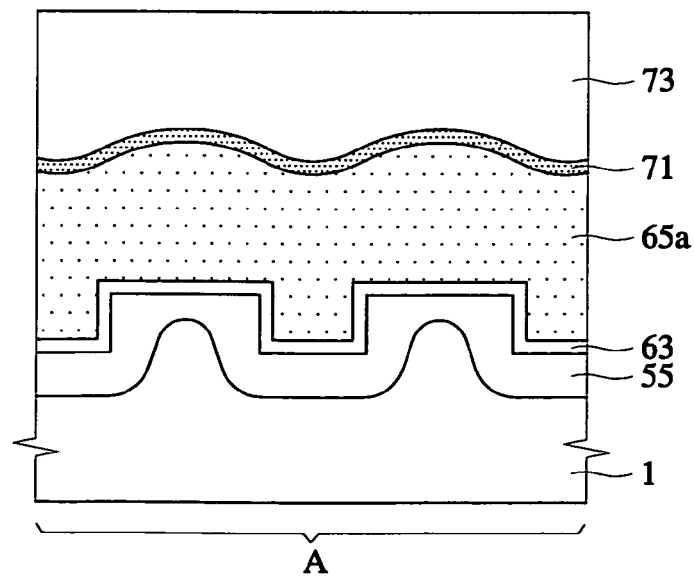
Figure 13C:
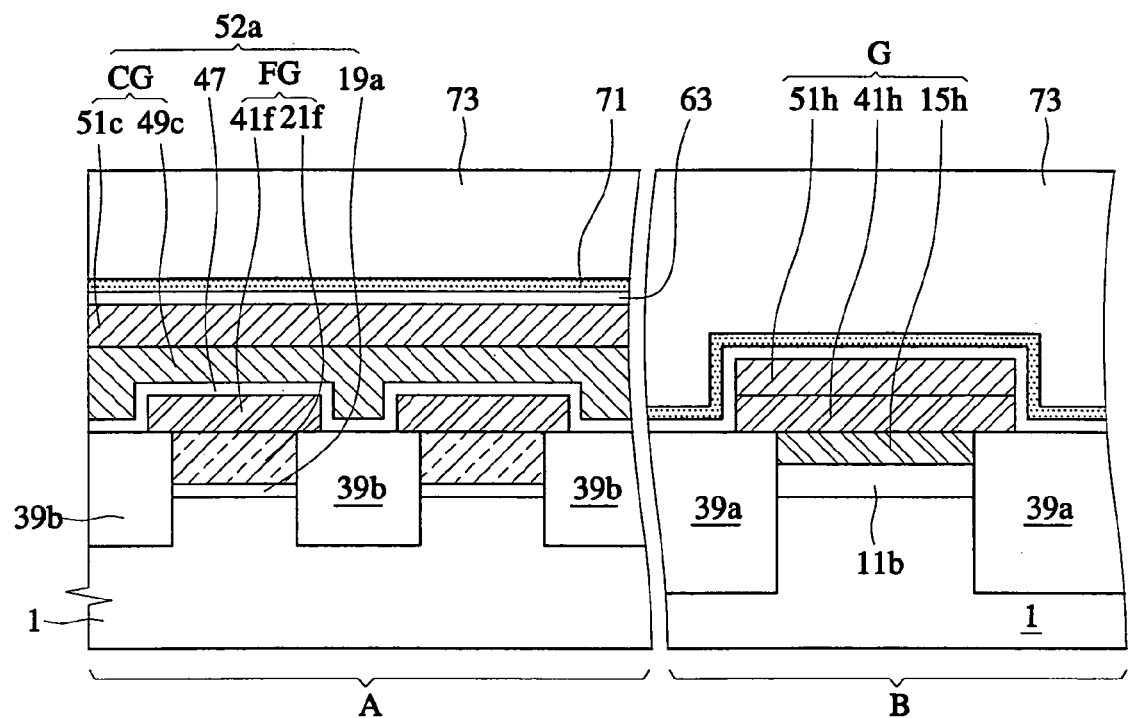
Figure 13D:
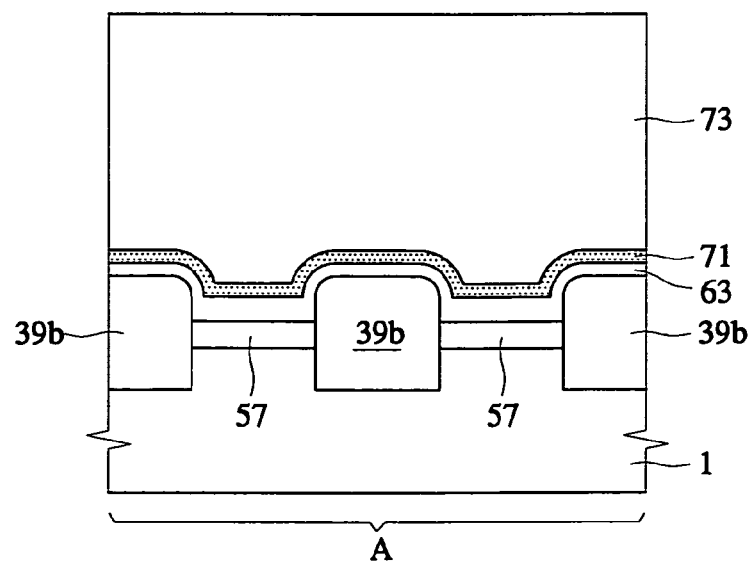

Referring to FIG. 1, a peripheral circuit gate electrode G extends across the peripheral circuit active region 37p. Also, as shown in FIG. 12A, the peripheral circuit gate electrode G includes a lower gate electrode 15h, a first upper gate electrode 41h and a second upper gate electrode 51h, which are sequentially stacked. A gate insulating layer 11b is disposed between the peripheral circuit gate electrode G and the peripheral circuit active region 37p. The gate insulating layer 11b may be a high voltage gate insulating layer or a low voltage gate insulating layer.

LDD-type source/drain regions are formed at the peripheral circuit active region 37p. The LDD-type source/drain regions are formed on both sides of the peripheral circuit gate electrode G. Each of the LDD-type source/drain regions includes a low concentration source/drain region 61 adjacent the peripheral circuit gate electrode G and a high concentration source/drain region 69 adjacent the low concentration source/drain region 61.

A stress buffer oxide layer 63 may be interposed between the recessed spacer layer patterns 65a and the common source regions 55. The stress buffer oxide layer 63 preferably covers the stacked gate patterns 52a, the drain regions 57, the device isolation layers 39a and 39b, the LDD-type source/drain regions, and the peripheral circuit gate electrode G. The stress buffer oxide layer 63 alleviates physical stresses applied to the recessed spacer layer patterns 65a.

Further, the surface of the semiconductor substrate having the recessed spacer layer patterns 65a is covered with a conformal etching stop layer 71 (FIG. 14A). The conformal etching stop layer 71 is covered with an interlayer insulating layer 73. It is preferable that the conformal etching stop layer 71 is an insulating layer having an etch selectivity with respect to the interlayer insulating layer 73. For example, the etching stop layer 71 may be a silicon nitride layer. In this case, the stress buffer oxide layer 63 is located under the etching stop layer 71 and the recessed spacer layer patterns 65a.

The LDD-type source/drain regions and the peripheral circuit gate electrode G are exposed by first contact holes 75 that penetrate the interlayer insulating layer 73 and the etching stop layer 71. Also, the drain regions 57 are exposed by second contact holes 77 that penetrate the interlayer insulating layer 73 and the etching stop layer 71. Plug ion implantation regions 78 may be additionally formed in the drain regions 57. The plug ion implantation regions 78 are self-aligned with the second contact holes 77. The first and second contact holes 75 and 77 are filled with first and second contact plugs 79a and 79b respectively. Metal interconnection lines 81a and 81b covering the first and second contact plugs 79a and 79b are disposed on the interlayer insulating layer 73.

Methods for manufacturing the flash memory devices according to an embodiment of the present invention will be described.

FIGS. 2A to 14A are sectional views taken along line I–I' of FIG. 1, and FIGS. 2B to 14B are sectional views taken along line II–II' of FIG. 1. Also, FIGS. 2C to 14C are sectional views taken along line III–III' of FIG. 1, and FIGS. 2D to 14D are sectional views taken along line IV–IV' of FIG. 1.

Referring to FIGS. 1, 2A, 2B, 2C and 2D, a semiconductor substrate 1 such as a P-type silicon wafer is prepared. The semiconductor substrate 1 includes a cell array region A and a peripheral circuit region B. The peripheral circuit region B may be a high voltage MOS transistor region or a low voltage MOS transistor region. In this embodiment, for simplicity, it is assumed that the peripheral circuit region B is an NMOS transistor region. A gate insulating layer 11 and a lower gate conductive layer 15 are sequentially formed on the semiconductor substrate 1. The lower gate conductive layer 15 may be a doped polysilicon layer. The lower gate conductive layer 15 and the gate insulating layer 11 are patterned to expose the semiconductor substrate 1 in the cell array region A. A tunnel insulating layer 19 and a lower floating gate layer 21 are sequentially formed on the exposed semiconductor substrate 1. The tunnel insulating layer 19 may comprises a thermal oxide layer. The lower floating gate layer 21 may comprises a doped polysilicon layer.

Referring to FIGS. 1, 3A, 3B, 3C and 3D, a polishing stop layer and a hard mask layer are sequentially formed on a surface of the semiconductor substrate 1 having the lower floating gate layer 21 and the lower gate conductive layer 15. The polishing stop layer and the hard mask layer are preferably formed of a silicon nitride layer and a chemical vapor deposition (CVD) oxide layer, respectively. A buffer oxide layer can be additionally formed prior to formation of the polishing stop layer. The buffer oxide layer acts as a stress buffer layer for alleviating physical stresses resulting from the polishing stop layer.

As shown in 3A, the hard mask layer, the polishing stop layer, the buffer oxide layer, the lower floating gate layer 21, the lower gate conductive layer, the tunnel oxide layer 19, and the gate insulating layer 11 are patterned to form first and second trench mask patterns 33a and 33b in the cell array region A and the peripheral circuit region B, respectively. As a result, each of the first trench mask patterns 33a includes a tunnel insulating layer pattern such as a tunnel oxide layer pattern 19a, a lower floating gate pattern 21a, a buffer oxide layer pattern 27a, a polishing stop layer pattern 29a, and a hard mask pattern 31a, which are sequentially stacked, and the second trench mask pattern 33b includes a gate insulating layer pattern 11b, a lower gate conductive layer pattern 15b, a buffer oxide layer pattern 27b, a polishing stop layer pattern 29b, and a hard mask pattern 31b, which are sequentially stacked.

Referring to FIGS. 1, 4A, 4B, 4C and 4D, a photoresist pattern 35 covering the cell array region A is formed. The semiconductor substrate 1 is etched using the photoresist pattern 35 and the second trench mask pattern 33b as etch masks, thereby forming a preliminary peripheral circuit trench region 37a in the peripheral circuit region B. The photoresist pattern 35 is then removed.

Referring to FIGS. 1, 5A, 5B, 5C and 5D, the semiconductor substrate 1 is again etched using the first and second trench mask patterns 33a and 33b as etch masks. As a result, a peripheral circuit trench region 37a', which is deeper than the preliminary peripheral circuit trench region 37a, is formed in the peripheral circuit region B, and a cell trench region 37b, which is shallower than the peripheral circuit trench region 37a', is formed in the cell array region A. The cell trench region 37b defines cell active regions 37c in the cell array region A, and the peripheral circuit trench region 37a' defines a peripheral circuit active region 37p in the peripheral circuit region B.

The peripheral circuit trench region 37a' is preferably formed to have a sufficient depth suitable for improving device isolation characteristics of a peripheral circuit MOS transistor to be formed in subsequent processes. On the contrary, the cell trench region 37b should have a shallow depth suitable for formation of a common source region to be formed in subsequent processes. As a result, it is preferable that the peripheral circuit trench region 37a' is deeper than the cell trench region 3b.

However, the trench regions 37a' and 37b may be formed using a single step of etching process without use of the photoresist pattern 35 shown in FIGS. 4A, 4B, 4C and 4D. In this case, the cell trench region 37b has the same depth as the peripheral circuit trench region 37a'.

Referring to FIGS. 1, 6A, 6B, 6C and 6D, a cell device isolation layer 39b and a peripheral circuit device isolation layer 39a are respectively formed in the cell trench region 37b and the peripheral circuit trench region 37a' using a conventional method. The hard mask patterns 31a and 31b are removed during formation of the device isolation layers 39a and 39b, thereby exposing the polishing stop layer patterns 29a and 29b. Preferably, the device isolation layers 39a and 39b are recessed as shown in FIGS. 6A, 6B, 6C and 6D to have substantially the same height as the top surfaces of the lower floating gate patterns 21a.

Referring to FIGS. 1, 7A, 7B, 7C and 7D, the polishing stop layer patterns 29a and 29b and the buffer oxide layer patterns 27a and 27b are removed to expose the lower floating gate patterns 21a and the lower gate conductive layer pattern 15b. A first conductive layer is formed on the semiconductor substrate 1 where the polishing stop layer patterns 29a and 29b as well as the buffer oxide layer patterns 27a and 27b are removed. The second conductive layer preferably may include a doped polysilicon layer. The second conductive layer is patterned to form upper floating gate patterns 41a covering the lower floating gate patterns 21a and concurrently form a first upper gate conductive layer 41b covering the peripheral circuit region B. The upper floating gate patterns 41a are preferably formed to be wider than the lower floating gate patterns 21a.

Subsequently, an inter-gate dielectric layer 47 and a second conductive layer 49 are sequentially formed on the semiconductor substrate having the upper floating gate patterns 41a and the first upper gate conductive layer 41b. The second conductive layer 49 may include a doped polysilicon layer.

Referring to FIGS. 1, 8A, 8B, 8C and 8D, the second conductive layer 49 and the inter-gate dielectric layer 47 are patterned to expose the first upper gate conductive layer 41b in the peripheral circuit region B. As a result, a first control gate conductive layer 49a is formed in the cell array region A, and the inter-gate dielectric layer 47 is remained under the first control gate conductive layer 49a. A third conductive layer 51 is formed on the semiconductor substrate having the first control gate conductive layer 49a. The third conductive layer 51 preferably includes a material layer that has a lower resistivity than the doped polysilicon layer. For example, the third conductive layer 51 may be formed of a metal silicide layer such as a tungsten silicide layer. The third conductive layer 51 on the cell array region A corresponds to a second control gate conductive layer, and the third conductive layer 51 on the peripheral circuit region B corresponds to a second upper gate conductive layer. The process for forming the third conductive layer 51 is omitted for simplicity.

In the cell array region A, the lower floating gate patterns 21a, the upper floating gate patterns 41a, the inter-gate dielectric layer 47, the first control gate conductive layer 49a and the second control gate conductive layer 51 constitute a stacked gate layer. Also, in the peripheral circuit region B, the first and second upper gate conductive layers 41b and 51 as well as the lower gate conductive layer pattern 15b constitute a peripheral circuit gate layer.

Referring to FIGS. 1, 9A, 9B, 9C and 9D, the stacked gate layer is patterned to form a plurality of first gate patterns 52a, e.g., stacked gate patterns that extend across the cell active regions 37c in the cell array region A. As a result, each of the stacked gate patterns 52a includes a tunnel insulating layer such as a tunnel oxide layer pattern 19a, a floating gate FG, an inter-gate dielectric layer 47 and a control gate electrode CG, which are sequentially stacked.

As shown in FIG. 1, the floating gates FG are formed at the intersections of the control gate electrodes CG and the cell active regions 37c. In other words, the floating gates FG are disposed between the control gate electrodes CG and the cell active regions 37c. On the contrary, the control gate electrodes CG extend across the cell active regions 37c as well as the cell device isolation layer 39b between the cell active regions 37c. Each of the floating gates FG includes a lower floating gate 21f and an upper floating gate 41f, which are sequentially stacked, and each of the control gate electrodes CG includes a first control gate electrode 49c and a second control gate electrode 51c, which are sequentially stacked.

The regions between the stacked gate patterns 52a include first spaces SO and second spaces DO. The first spaces SO have a first width S1, and the second spaces DO have a second width S2 greater than the first width S1. A photoresist pattern 53 is formed on the semiconductor substrate having the stacked gate patterns 52a. The photoresist pattern 53 is formed to cover the second spaces DO as well as the peripheral circuit region B. In other words, the photoresist pattern 53 is formed to selectively expose the first spaces SO.

Figure 10A:
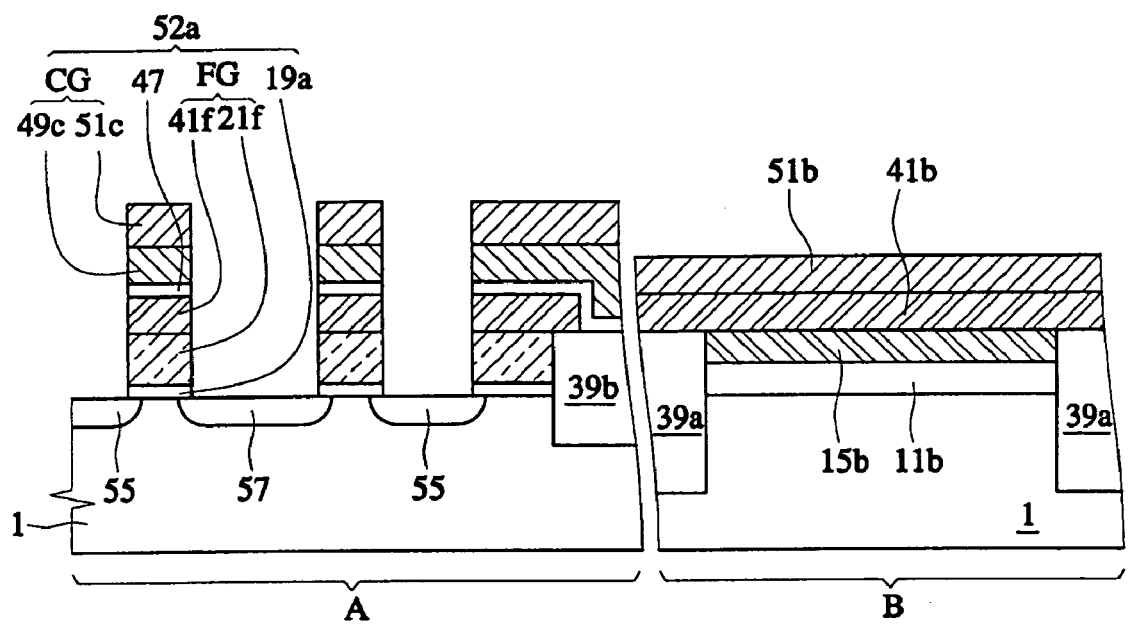
Figure 10B:
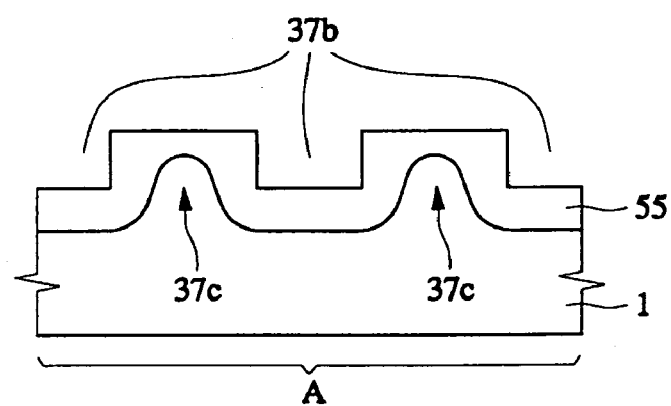
Figure 10C:
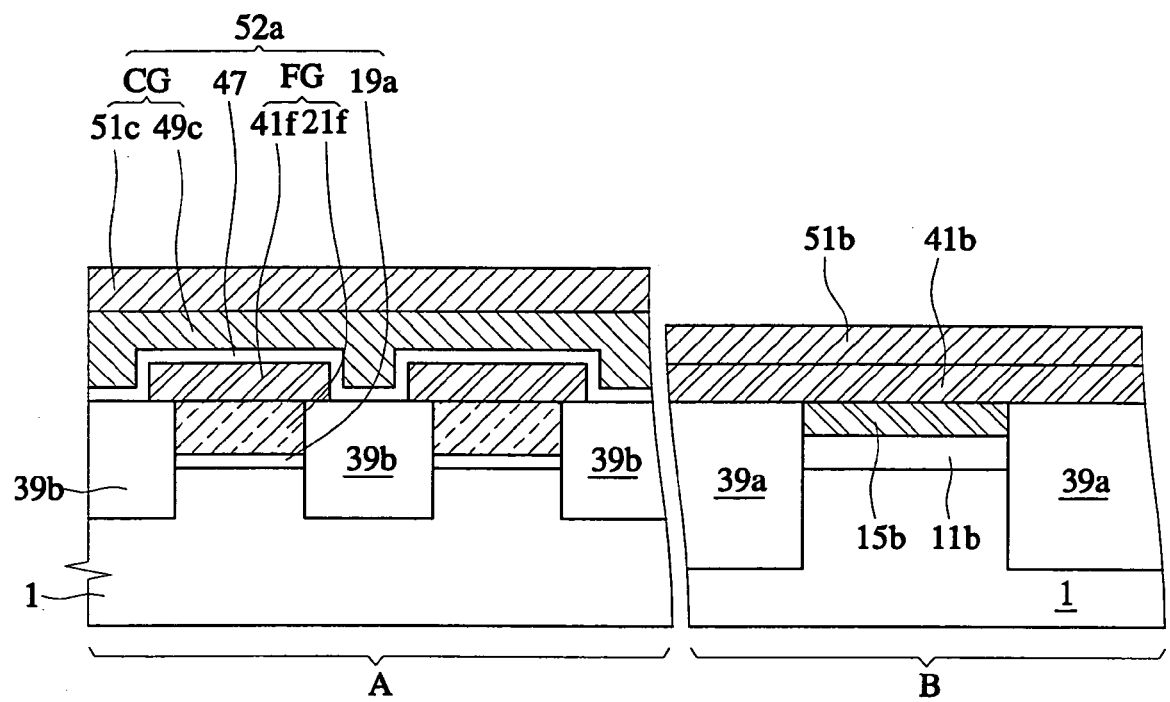
Figure 10D:
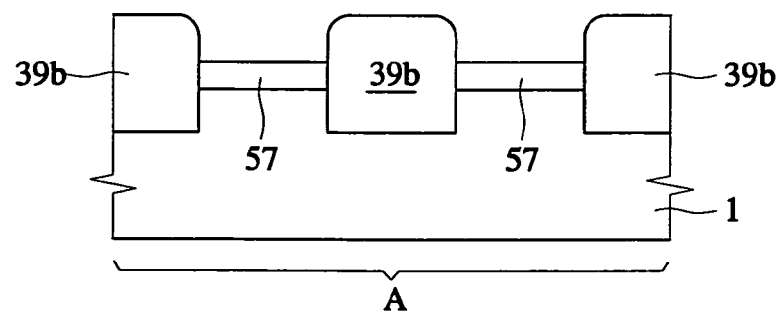
Figure 11A:
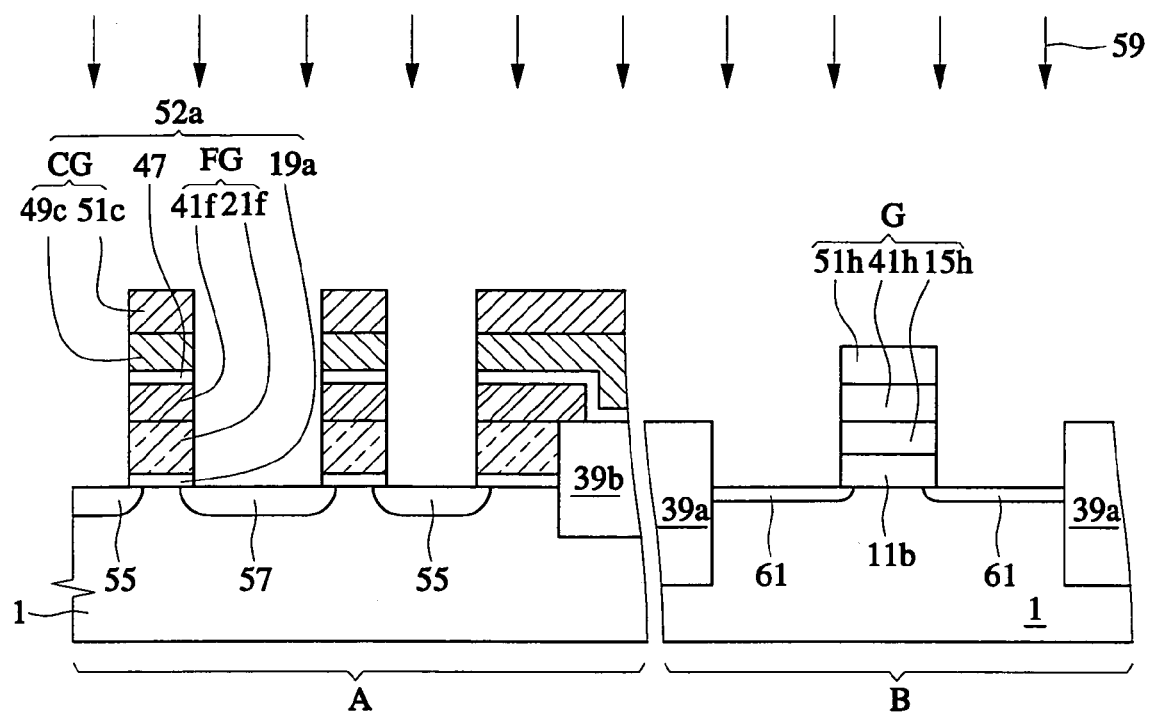
Figure 11B:
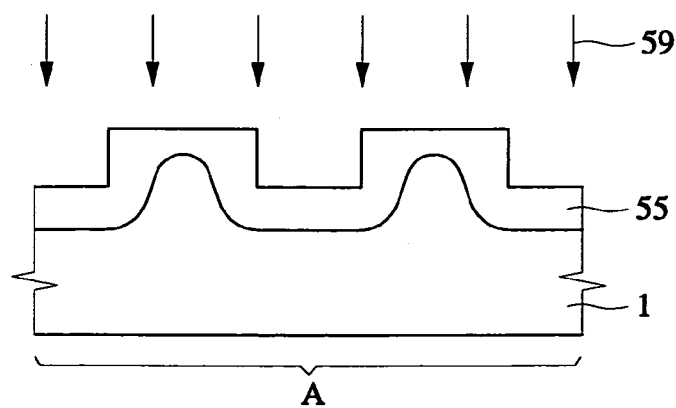
Figure 11C:
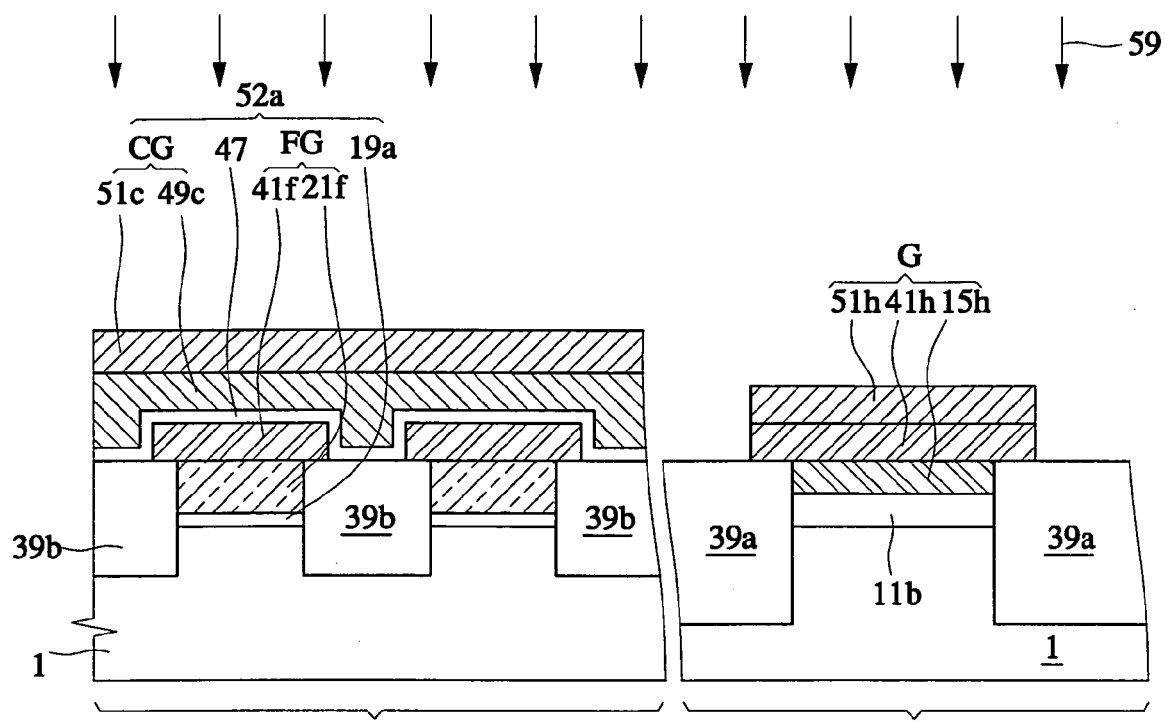
Figure 11D:
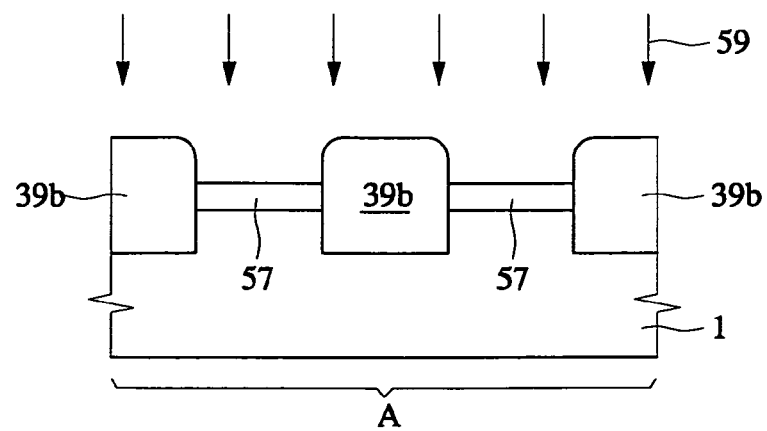

Referring to FIGS. 1, 10A, 10B, 10C and 10D, the cell device isolation layer 39b is selectively etched using the photoresist pattern 53 as an etch mask. As a result, as shown in FIG. 10B, the cell trench region 37b is again formed between the cell active regions 37c in the first spaces SO. That is, the bottom surfaces of the first spaces SO exhibit uneven and stepped profiles in the direction across the cell active regions 37c.

N-type impurity ions are implanted into the semiconductor substrate using the photoresist pattern 53 as an ion implantation mask. As a result, first impurity regions 55, e.g., common source regions having line shapes are formed at the surface of the semiconductor substrate exposed by the first spaces SO. In this case, the ion implantation process is preferably performed using a tilted ion implantation process in order to reduce electrical resistance of the common source regions 55 formed at side walls of the cell trench regions in the first spaces SO. In addition, the trench region 37b is preferably shallow to reduce the electrical resistance of the common source regions 55 as described in FIGS. 9A to 9D.

Subsequently, after removing the photoresist pattern 53, N-type impurity ions are selectively implanted into the first and second spaces SO and DO using the stacked gate patterns 52a, the upper gate conductive layers 41b and 51b, and the cell device isolation layer 39b as ion implantation masks. As a result, island-shaped second impurity regions 57, e.g., drain regions are formed at the surfaces of the cell active regions 37c exposed by the second spaces DO. During the ion implantation process for forming the drain regions 57, the N-type impurity ions are additionally implanted into the common source regions 55. Therefore, the impurity concentration of the common source regions 55 is more increased to reduce the electrical resistance of the common source regions 55.

The ion implantation process for forming the common source regions 55 may be omitted prior to removal of the photoresist pattern 53. In this case, the common source regions 55 and the drain regions 57 are concurrently formed using only a single step ion implantation process.

Referring to FIGS. 1, 11A, 11B, 11C and 11D, the peripheral circuit gate layer is patterned to form a second gate pattern G, e.g., a peripheral circuit gate electrode in the peripheral circuit region B. The peripheral circuit gate electrode G extends across the peripheral circuit active region 37p. The peripheral circuit gate electrode G includes a lower gate electrode 15h, a first upper gate electrode 41h and a second upper gate electrode 51h, which are sequentially stacked.

N-type impurity ions 59 are implanted into the active regions 37c and 37p at a low dose of $1\times10^{12}$ atoms/cm$^2$ to $1\times10^{14}$ atoms/cm$^2$ using the stacked gate patterns 52a, the peripheral circuit gate electrode G, and the device isolation layers 39a and 39b as ion implantation masks. As a result, low concentration source/drain regions 61 are formed at the peripheral circuit active region 37p.

Referring to FIGS. 1, 12A, 12B, 12C and 12D, a spacer layer is formed on the semiconductor substrate having the low concentration source/drain regions 61. The spacer layer may include an insulating layer having an etching selectivity with respect to a silicon oxide layer. For example, the spacer layer may include a silicon nitride layer. Also, the spacer layer is formed to a thickness that is greater than half of the first width S1 and less than half of the second width S2. Therefore, the first spaces SO are filled with the spacer layer. A stress buffer oxide layer 63 is preferably formed on the semiconductor substrate 1 having the low concentration source/drain regions 61 prior to formation of the spacer layer. The stress buffer oxide layer 63 is formed in order to alleviate the stress applied to the spacer layer. The stress buffer oxide layer 63 may be formed of a CVD oxide layer such as a medium temperature oxide (MTO) layer. Further, the stress buffer oxide layer 63 is preferably formed to a thin thickness of about 200 angstroms.

As shown in FIG. 12, the spacer layer is anisotropically etched to form spacers 65 on sidewalls of the second spaces DO and on sidewalls of the peripheral circuit gate electrode G. In this case, the first spaces SO are still filled with the anisotropically etched spacer layer patterns 65'. In other words, the stress buffer oxide layer 63 on the common source regions 55 is still covered with the spacer layer patterns 65' even after the spacers 65 are formed. On the other hand, the stress buffer oxide layers 63 on the drain regions 57 and the low concentration source/drain regions 61 are exposed after the spacers 65 are formed.

If the spacer layer is over-etched, the drain regions 57 and the low concentration source/drain regions 61 may be exposed. Nevertheless, the spacer layer patterns 65' on the common source regions 55 have a different configuration from the spacers 65 and are not easily removed.

A photoresist pattern 67 covering the cell array region A is then formed. Using the photoresist pattern 67, the peripheral circuit gate electrode G, the spacers 65 and the peripheral circuit device isolation layer 39a as ion implantation masks, N-type impurity ions are implanted into the peripheral circuit active region 37p at a high dose of $1 \times 10^{15}$ atoms/cm$^2$ to $5 \times 10^{15}$ atoms/cm$^2$, thereby forming high concentration source/drain regions 69 adjacent the low concentration source/drain regions 61. As a result, LDD-type source/drain regions including the low concentration source/drain regions 61 and the high concentration source/drain regions 69 are formed in the peripheral circuit region B. Each of the second spaces DO has a third width S3, which is less than the second width (S2 of FIGS. 14A and 1) because of the spacers 65.

Referring to FIGS. 1, 13A, 13B, 13C and 13D, the photoresist pattern 67 is removed. In general, the spacers 65 are used in formation of the LDD-type source/drain regions as described above. Therefore, it is preferable that the spacers 65 are removed after formation of the LDD-type source/drain regions. This is because the spacers 65 may cause problems in subsequent processing steps. For example, when the spacers 65 exist, there is a limitation in increasing the widths of contact holes to be formed in order to expose the drain regions 57 and the LDD-type source/drain regions in subsequent processes. On the contrary, it is preferable that the spacer layer patterns 65' in the first spaces SO are not removed. This is because when the spacer layer patterns 65' are removed the aspect ratio of the first spaces SO is greatly increased to generate voids in the first spaces SO during formation of an interlayer insulating layer in subsequent processes. These voids may cause unstable electrical characteristics in flash memory cells.

As a result, it is preferable that the spacers 65 are removed using a wet etching process. The wet etching process may be performed using a phosphoric acid ($H_3PO_4$). The spacer layer patterns 65' should not be removed during the wet etching process. Therefore, the wet etching process should be performed for a proper duration. As a result, recessed spacer layer patterns 65a remain in the first spaces SO.

Preferably, an etching stop layer 71 is formed on the semiconductor substrate 1 having the recessed spacer layer patterns 65a. The etching stop layer 71 is formed to a thickness, which is less than the width of the spacers 65. Thus, the second spaces DO have a fourth width S4 that is greater than the third width S3. The etching stop layer 71 may be formed of an insulating layer that has an etching selectivity with respect to a conventional interlayer insulating layer. For example, the etching stop layer 71 may include a silicon nitride layer. An interlayer insulating layer 73 is formed on the etching stop layer 71. In this case, voids can be prevented from being formed in the first spaces SO because of the presence of the recessed spacer layer patterns 65a.

Referring to FIGS. 1, 14A, 14B, 14C and 14D, the interlayer insulating layer 73, the etching stop layer 71 and the stress buffer oxide layer 63 are patterned to form first contact holes 75 that expose the LDD-type source/drain regions in the peripheral circuit region B. The peripheral circuit gate electrode G may be also exposed during formation of the first contact holes 75. Then, the interlayer insulating layer 73, the etching stop layer 71 and the stress buffer oxide layer 63 are again patterned to form second contact holes 77 that expose the drain regions 57. Removal of the spacers 65 may lead to maximization of widths of the first and second contact holes 75 and 77. As a result, it is possible to reduce contact resistance.

Furthermore, N-type impurity ions may be additionally implanted into the drain regions 57 through the second contact holes 77. As a result, plug ion implantation regions 78, which are self-aligned with the second contact holes 77, are formed in the drain regions 57. The plug ion implantation regions 78 lead to a reduction in the contact resistance of the drain regions 57 and prevent the junction spiking phenomenon from being occurred in the drain regions 57.

Alternatively, the first contact holes 75 and the second contact holes 77 can be concurrently formed using a single step of an etching process.

Subsequently, first and second contact plugs 79a and 79b are respectively formed in the first and second contact holes 75 and 77 using a conventional method. The contact plugs 79a and 79b are formed of a tungsten layer.

A metal layer such as an aluminum layer is formed on the interlayer insulating layer 73. The metal layer is patterned to form first metal interconnection lines 81a and second metal interconnection lines 81b in the peripheral circuit region B and the cell array region A, respectively. The second metal interconnection lines 81b extend across the control gate electrodes CG and acts as bit lines of flash memory cells. The bit lines 81b are electrically connected to the drain regions 57 through the second contact plugs 79b. The first and second metal interconnection lines 81a and 81b may be formed using a conventional damascene process that employs a metal layer such as a copper layer.

According to the present invention as described above, narrow spaces of the regions between the stacked gate patterns are filled with recessed spacer layer patterns, whereas spacers formed on sidewalls of the stacked gate patterns and the peripheral circuit gate electrode are removed after formation of LDD-type source/drain regions in the peripheral circuit region. Accordingly, it is possible to maximize widths of contact holes that expose the source/drain regions, and it can prevent voids from being formed in the narrow spaces. As a result, reliable and highly-integrated flash memory devices can be realized.

While the present invention has been particularly shown and described with reference to the exemplary embodiments thereof, it will be understood by those skilled in the art that the foregoing and other changes in form and details may be made therein without departing from the spirit and scope of the present invention.

What is claimed is:

1. A method of manufacturing a semiconductor integrated circuit, said method comprising:

forming a device isolation layer in a semiconductor substrate to define first and second active regions;

forming a plurality of first gate patterns that extend across the first active region and the device isolation layer, regions between the first gate patterns including a first space having a first width and a second space having a second width greater than the first width;

selectively removing the device isolation layer exposed by the first space;

forming a line-shaped first impurity region and an island-shaped second impurity region at the surface of the semiconductor substrate exposed by the first space and at the first active region exposed by the second space, respectively;

forming a second gate pattern that extends across the second active region;

forming low concentration source/drain regions at the second active region located on both sides of the second gate pattern;

forming spacers on sidewalls of the second space and on sidewalls of the second gate pattern as well as a spacer layer pattern filling the first space;

forming high concentration source/drain regions adjacent the low concentration source/drain regions at the second active region;

removing said spacers to expose the sidewalls of the second space and the second gate pattern and leaving a recessed spacer layer pattern in the first space; and forming a conformal etching stop layer on the semiconductor substrate having the recessed spacer layer pattern.

2. The method of claim 1, wherein the first active region is defined in a first region of the semiconductor substrate and the second active region is defined in a second region of the semiconductor substrate.

3. The method of claim 1, wherein the device isolation layer is formed using a trench isolation technique.

4. The method of claim 1, wherein selectively removing the device isolation layer exposed by the first space comprises:

forming a photoresist pattern that exposes the first space; and etching the device isolation layer using the photoresist pattern as an etch mask until the semiconductor substrate contacting the device isolation layer in the first space is exposed.

5. The method of claim 4, wherein forming the first and second impurity regions comprises:

implanting first impurity ions into the semiconductor substrate exposed by the first space using the photoresist pattern as an ion implantation mask;

removing the photoresist pattern; and implanting second impurity ions into the semiconductor substrate exposed by the first space and the second space using the first gate patterns and the device isolation layer as an ion implantation mask.

6. The method of claim 1, wherein forming the spacers and the spacer layer pattern comprises:

forming a spacer layer on the semiconductor substrate having the low concentration source/drain regions, the spacer layer being formed to a thickness which is greater than half of the first width and less than half of the second width; and anisotropically etching the spacer layer to expose the second impurity region and the low concentration source/drain regions and to concurrently remain anisotropically etched spacer layer that fills the first space.

7. The method of claim 6, wherein the spacer layer comprises silicon nitride.

8. The method of claim 7, further comprising forming a conformal stress buffer oxide layer on the semiconductor substrate having the low concentration source/drain regions before forming the spacer layer.

9. The method of claim 1, further comprising forming an interlayer insulating layer on the semiconductor substrate having the etching stop layer.

10. The method of claim 9, wherein the etching stop layer is formed of an insulating layer that has an etching selectivity with respect to the interlayer insulating layer.

11. The method of claim 9, further comprising:

patterning the interlayer insulating layer and the etching stop layer to form a first contact hole exposing the high concentration source/drain regions and the second gate pattern;

patterning the interlayer insulating layer and the etching stop layer to form a second contact hole exposing the second impurity region;

selectively applying a plug ion implantation process to the second impurity region exposed by the second contact hole;

forming contact plugs that fill the first and second contact holes; and forming metal interconnection lines on the interlayer insulating layer, the metal interconnection lines being formed to cover the contact plugs.

12. A method of manufacturing a flash memory device, the method comprising:

providing a semiconductor substrate having a cell array region and a peripheral circuit region;

forming a device isolation layer in a portion of the semiconductor substrate to define a cell active region in the cell array region and a peripheral circuit active region in the peripheral circuit region;

forming a stacked gate layer on the cell array region and a peripheral circuit gate layer on the peripheral circuit region;

patterning the stacked gate layer to form a plurality of stacked gate patterns that extend across the cell active region and the device isolation layer, regions between the stacked gate patterns including first spaces having a first width and second spaces having a second width greater than the first width;

selectively removing a portion of the device isolation layer exposed by the first spaces;

forming line-shaped common source regions and island-shaped drain regions at the surface of the semiconductor substrate exposed by the first spaces and at the surface of the cell active region exposed by the second spaces, respectively;

patterning the peripheral circuit gate layer to form a peripheral circuit gate electrode extending across the peripheral circuit active region;

implanting impurity ions into the peripheral circuit active region, using the peripheral circuit gate electrode as an ion implantation mask to form low concentration source/drain regions at the peripheral circuit active region;

forming spacer layer patterns filling the first spaces as well as spacers covering sidewalls of the second spaces and also sidewalls of the peripheral circuit gate electrode;

implanting impurity ions into the peripheral circuit active region at a second dose higher than the first dose, using the peripheral circuit gate electrode and the spacer on the sidewall of the peripheral circuit gate electrode as ion implantation masks, thereby providing high concentration source/drain regions;

removing the spacers to expose the sidewalls of the second spaces and the sidewall of the peripheral circuit gate electrode and to concurrently leave recessed spacer layer patterns in the first spaces; and forming a conformal etching stop layer on the semiconductor substrate having the recessed spacer layer patterns.

13. The method of claim 12, wherein forming the device isolation layer comprises:

forming first and second trench mask patterns on the semiconductor substrate in the cell array region and on the semiconductor substrate in the peripheral circuit region respectively;

etching the semiconductor substrate using the first and second trench mask patterns as etching masks to form a cell trench region in the cell array region and a peripheral circuit trench region in the peripheral circuit region; and forming a cell device isolation layer in the cell trench region and a peripheral circuit device isolation layer in the peripheral circuit trench region.

14. The method of claim 13, wherein forming the first and second trench mask patterns comprises:

sequentially forming a gate insulating layer and a lower gate conductive layer on the semiconductor substrate;

patterning the lower gate conductive layer and the gate insulating layer to expose the semiconductor substrate in the cell array region;

sequentially forming a tunnel insulating layer and a lower floating gate layer on the exposed semiconductor substrate;

forming a trench mask layer on the semiconductor substrate having the lower floating gate layer and the lower gate conductive layer, the trench mask layer being formed by sequentially stacking a polishing stop layer and a hard mask layer; and patterning the trench mask layer.

15. The method of claim 13, wherein forming the cell trench region and the peripheral circuit trench region comprises:

forming a photoresist pattern covering the cell array region on the semiconductor substrate having the first and the second trench mask patterns;

etching the semiconductor substrate, using the photoresist pattern and the second trench mask pattern as etching masks, to form a preliminary peripheral circuit trench region in the peripheral circuit region;

removing the photoresist pattern; and etching the semiconductor substrate using the first and second trench mask patterns as etching masks to form a trench region having a first depth and another trench region having a second depth greater than the first depth in the cell array region and the peripheral circuit region, respectively.

16. The method of claim 14, wherein forming the stacked gate layer and the peripheral circuit gate layer comprises:

removing the patterned trench mask layer to expose the lower floating gate layer and the lower gate conductive layer;

forming an upper floating gate pattern covering the exposed lower floating gate layer and a first upper gate conductive layer covering the peripheral circuit region; and sequentially forming an inter-gate dielectric layer and a first control gate conductive layer on the cell array region having the upper floating gate pattern.

17. The method of claim 16 further comprising forming a metal silicide layer on the first control gate conductive layer and the first upper gate conductive layer.

18. The method of claim 12, wherein selective removing the device isolation layer exposed by the first spaces comprises:

forming a photoresist pattern exposing the first spaces on the semiconductor substrate having the stacked gate patterns; and etching the device isolation layer, using the photoresist pattern as an etching mask, to expose the semiconductor substrate that contacts the device isolation layer in the first spaces.

19. The method of claim 18, wherein forming the common source regions and the drain regions comprises:

implanting first impurity ions into the semiconductor substrate exposed by the first spaces, using the photoresist pattern as an ion implantation mask;

removing the photoresist pattern; and implanting second impurity ions into the semiconductor substrate in the cell array region, using the stacked gate patterns and the device isolation layer as ion implantation masks.

20. The method of claim 12, wherein forming the spacers and the spacer layer patterns comprises:

forming a spacer layer on the semiconductor substrate having the low concentration source/drain regions to a thickness greater than half of the first width and less than half of the second width; and anisotropically etching the spacer layer to expose the island shaped drain regions and the low concentration source/drain regions and to concurrently leave the anisotropically etched spacer layer that fills the first spaces.

21. The method of claim 20, wherein the spacer layer is formed of silicon nitride.

22. The method of claim 21, further comprising forming a conformal stress buffer oxide layer on the semiconductor substrate having the low concentration source/drain regions before forming the spacer layer.

23. The method of claim 12, further comprising forming an interlayer insulating layer on the etching stop layer.

24. The method of claim 23, wherein the etching stop layer is formed of an insulating layer having an etching selectivity with respect to the interlayer insulating layer.

25. The method of claim 23, further comprising:

patterning the interlayer insulating layer and the etching stop layer to form first contact holes exposing the high concentration source/drain regions and the peripheral circuit gate electrode;

patterning the interlayer insulating layer and the etching stop layer to form second contact holes exposing the island shaped drain regions in the cell array region;

selectively applying a plug ion implantation process to the island shaped drain regions exposed by the second contact holes;

forming contact plugs that fill the first and second contact holes; and forming metal interconnection lines on the interlayer insulating layer, the metal interconnection lines being formed to cover the contact plugs.

26. A method of manufacturing a semiconductor integrated circuit, the method comprising:

forming a device isolation layer in a semiconductor substrate to define first and second active regions;

forming a plurality of first gate patterns that extend across the first active region, regions between the first gate patterns including a first space having a first width and a second space having a second width greater than the first width;

forming a first impurity region and a second impurity region at the surface of the first active region exposed through the first space and at the first active region exposed through the second space, respectively;

forming a second gate pattern that extends across the second active region;

forming low concentration source/drain regions at the second active region located on both sides of the second gate pattern;

forming spacers on sidewalls of the second space and on sidewalls of the second gate pattern as well as a spacer layer pattern filling the first space;

forming high concentration source/drain regions adjacent the low concentration source/drain regions at the second active region; and removing said spacers to expose the sidewalls of the second space and the second gate pattern wherein a recessed spacer layer pattern in the first space remains.

27. The method of claim 26, further comprising:

forming a conformal etching stop layer on the semiconductor substrate having the recessed spacer layer pattern.

* * * * *

UNITED STATES PATENT AND TRADEMARK OFFICE
CERTIFICATE OF CORRECTION

| | |
|---|---|
| PATENT NO. | : 7,045,413 B2 |
| APPLICATION NO. | : 10/773805 |
| DATED | : May 16, 2006 |
| INVENTOR(S) | : Sang-Eun Lee et al. |

It is certified that error appears in the above-identified patent and that said Letters Patent is hereby corrected as shown below:

Column 8, line 15, the word "3b" should read -- 37b --.

Signed and Sealed this

Fourth Day of August, 2009

JOHN DOLL
*Acting Director of the United States Patent and Trademark Office*